United States Patent
Steyn

(10) Patent No.: US 10,948,367 B2
(45) Date of Patent: Mar. 16, 2021

(54) INPUT INTERFACE DEVICE WITH SEMICONDUCTOR STRAIN GAGE

(71) Applicant: Jasper Lodewyk Steyn, Campbell, CA (US)

(72) Inventor: Jasper Lodewyk Steyn, Campbell, CA (US)

( * ) Notice: Subject to any disclaimer, the term of this patent is extended or adjusted under 35 U.S.C. 154(b) by 359 days.

(21) Appl. No.: 15/903,005

(22) Filed: Feb. 22, 2018

(65) Prior Publication Data

US 2019/0257704 A1    Aug. 22, 2019

(51) Int. Cl.
*G01L 1/22*    (2006.01)
*H05K 1/18*    (2006.01)
*H05K 1/02*    (2006.01)

(52) U.S. Cl.
CPC ............ *G01L 1/2293* (2013.01); *H05K 1/028* (2013.01); *H05K 1/181* (2013.01); *G01L 1/225* (2013.01);
(Continued)

(58) Field of Classification Search
CPC ......... G01L 1/2293; G01L 1/22; G01L 1/225; H05K 1/181; H05K 1/028;
(Continued)

(56) References Cited

U.S. PATENT DOCUMENTS

| | | | | |
|---|---|---|---|---|
| 5,546,644 | A * | 8/1996 | Kakizaki | ................. G01P 1/023 29/25.35 |
| 7,102,542 | B2 * | 9/2006 | Lin | ........................ H03M 11/10 340/517 |

(Continued)

*Primary Examiner* — Nathaniel T Woodward
(74) *Attorney, Agent, or Firm* — Creso Legal LLP

(57) ABSTRACT

The invention provides for an interface device that measures strain on a specific area of the printed circuit board. The measurements are converted into an electrical signal and sent for processing. The processing results in the apparatus performing a desired function.

The interface device includes a printed circuit board. The printed circuit board comprises a plurality of layers, including a conductive layer. The interface device further includes a strain sensing device. The strain sensing device is mounted on the printed circuit board and includes a substrate, a strain sensing element, and associated circuitry. In some instances, the strain sensing device includes one strain sensing element and in other instances multiple strain sensing elements can also be used. In one embodiment, the strain sensing device can include a piezoresistive strain gage combined with signal conditioning circuitry such that a single electronic component can be mounted on the printed circuit board for reduced cost and improved signal-to-noise performance.

In operation, a user or another device applies force on the printed circuit board in the area of the strain sensing device. The strain sensitive element deforms in response to the applied force or strain on the printed circuit board. The deformation results in the change of resistance or conductivity of the strain sensitive element. The associated circuitry, which can be a signal conditioning circuit, converts the change in resistance or conductivity into a digital signal. Once the conversion occurs, the associated circuitry uses the conductive layer of the printed circuit board to communicate the digital signal to either the processor or the processing circuit of the electronic apparatus. The processor or processing circuit receives the digital signal and responds by performing a desired action.

In one instance the interface device may be used to measure the magnitude of the force applied by a finger pressing on the touch screen of an electronic apparatus such as a cell phone. The magnitude of the applied force can then be used to control, the operation of the cell phone. A high magnitude force would result in a higher strain being sensed and can cause the apparatus to operate in one way, whereas a low magnitude force would result in a lower strain being sensed and can cause the apparatus to operate in another way, e.g., in a mobile phone environment where an application is used to draw a picture, a light force applied to the touch screen could be processed to result in a thin line being drawn and a stronger force could be processed to result in a wider line being drawn.

In another instance the interface device may be used to measure the magnitude of the force applied to a control toggle on the steering wheel of a car. The toggle may be used (Continued)

to control the intensity of the sound emitted from the audio system in the car. A high magnitude force could be processed to cause the intensity of the sound to change rapidly whereas a low magnitude force could be processed to cause the intensity of the sound to change slowly.

21 Claims, 19 Drawing Sheets

(52) U.S. Cl.
CPC .............. *H05K 2201/09036* (2013.01); *H05K 2201/10151* (2013.01); *H05K 2201/10522* (2013.01)

(58) Field of Classification Search
CPC .......... H05K 2201/10522; H05K 2201/10151; H05K 2201/09036
USPC .................................................... 73/862.632
See application file for complete search history.

(56) References Cited

U.S. PATENT DOCUMENTS

| | | | | |
|---|---|---|---|---|
| 7,244,257 | B2 * | 7/2007 | Podhajsky | A61B 18/1402 606/41 |
| 7,623,116 | B1 * | 11/2009 | Bidiville | G06F 3/0485 200/5 A |
| 2003/0150276 | A1 * | 8/2003 | Christensen | G01L 1/2231 73/795 |
| 2013/0127295 | A1 * | 5/2013 | Jun | H01L 41/1134 310/327 |
| 2017/0194114 | A1 * | 7/2017 | Towers | H01H 13/52 |

\* cited by examiner

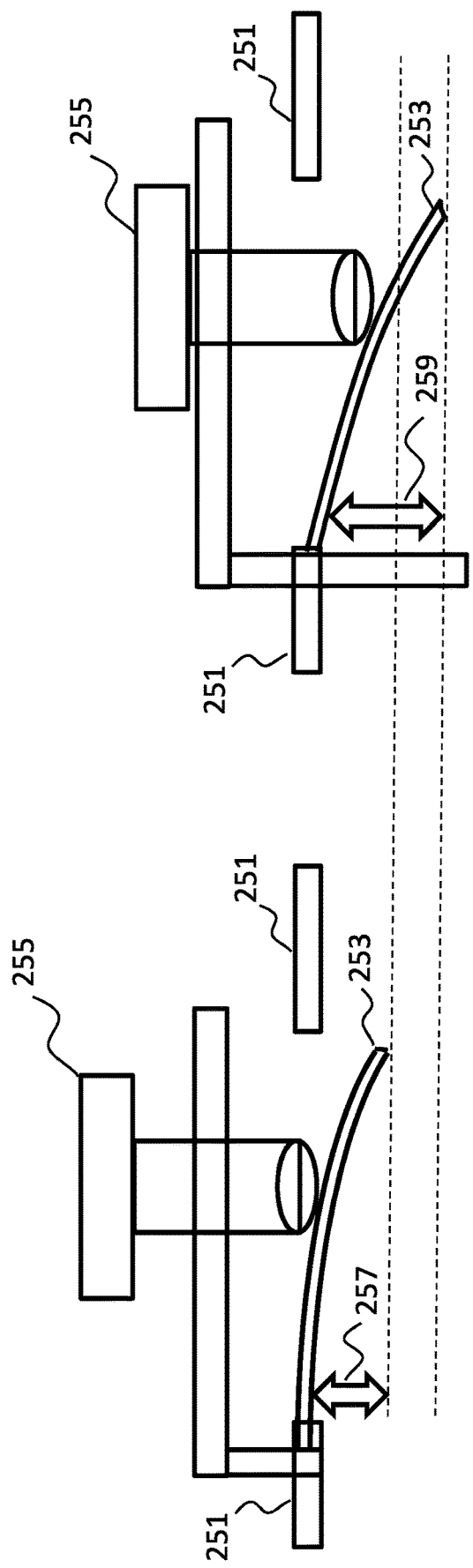

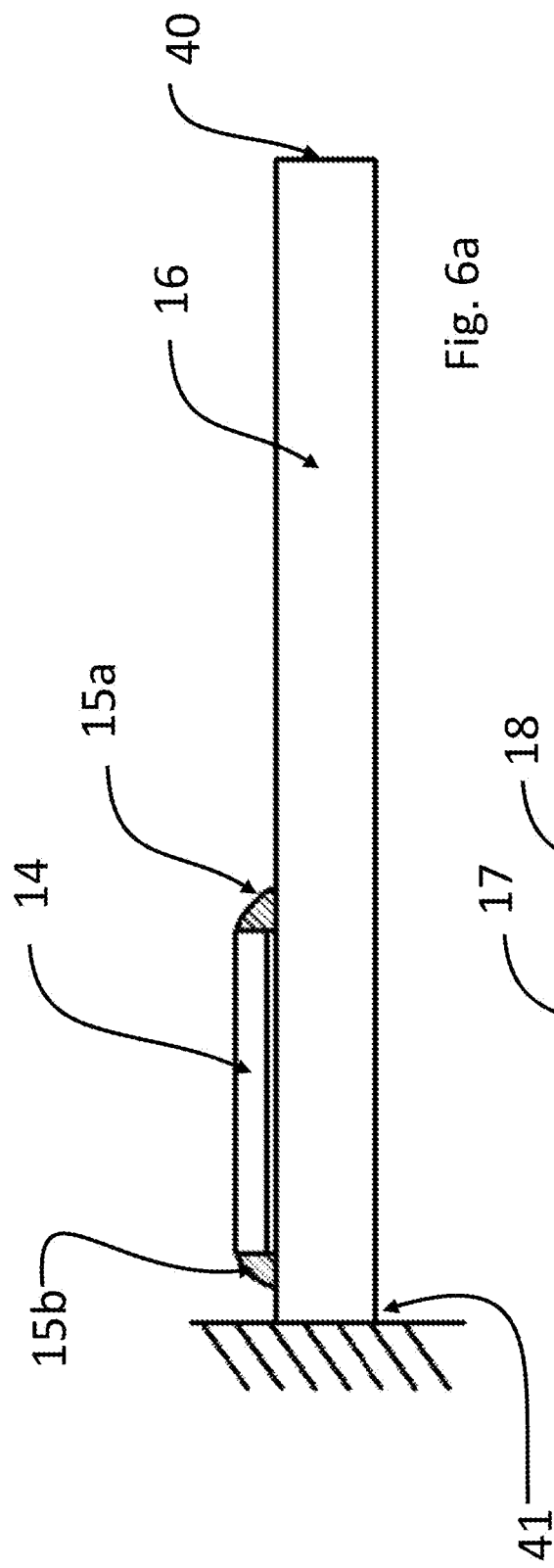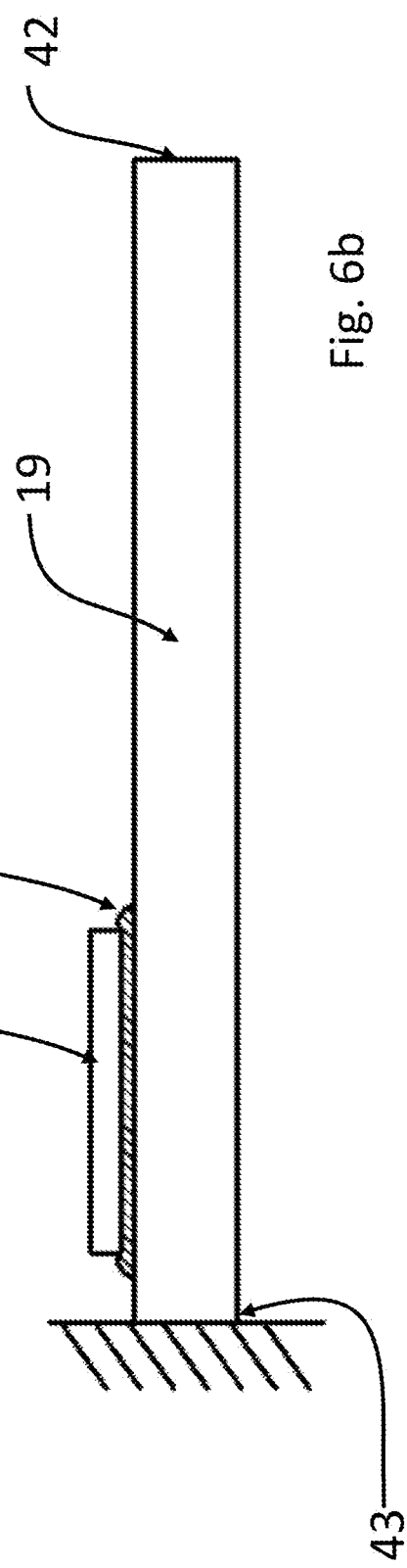
Fig. 6a
Fig. 6b

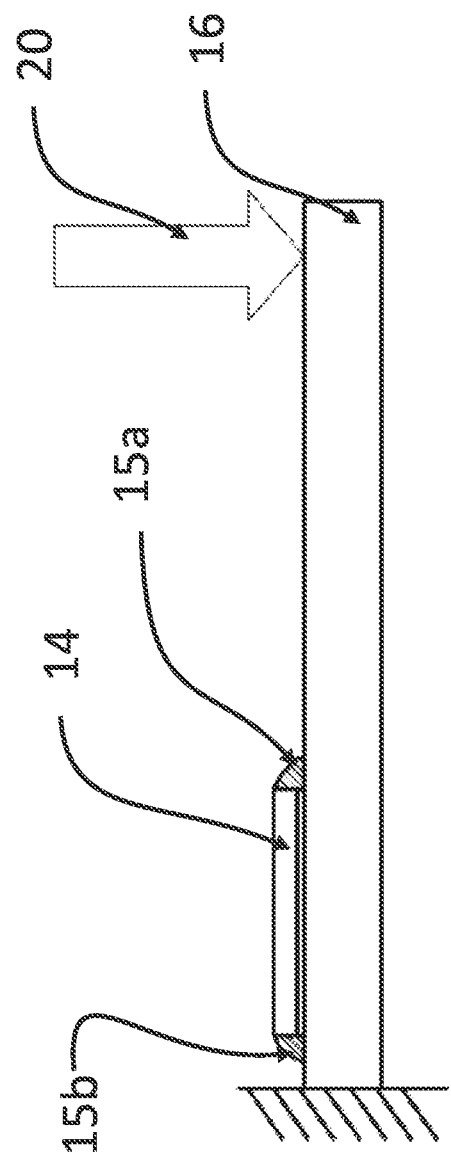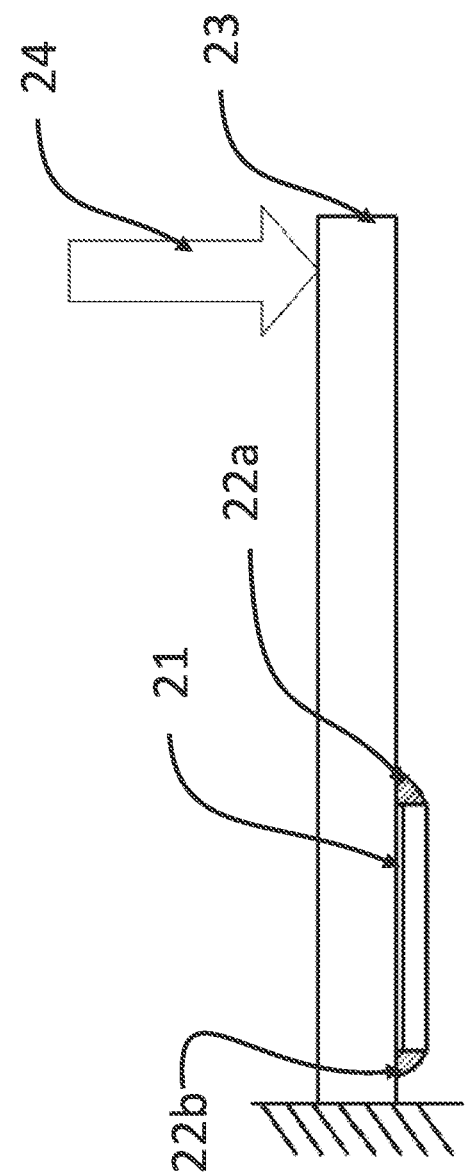

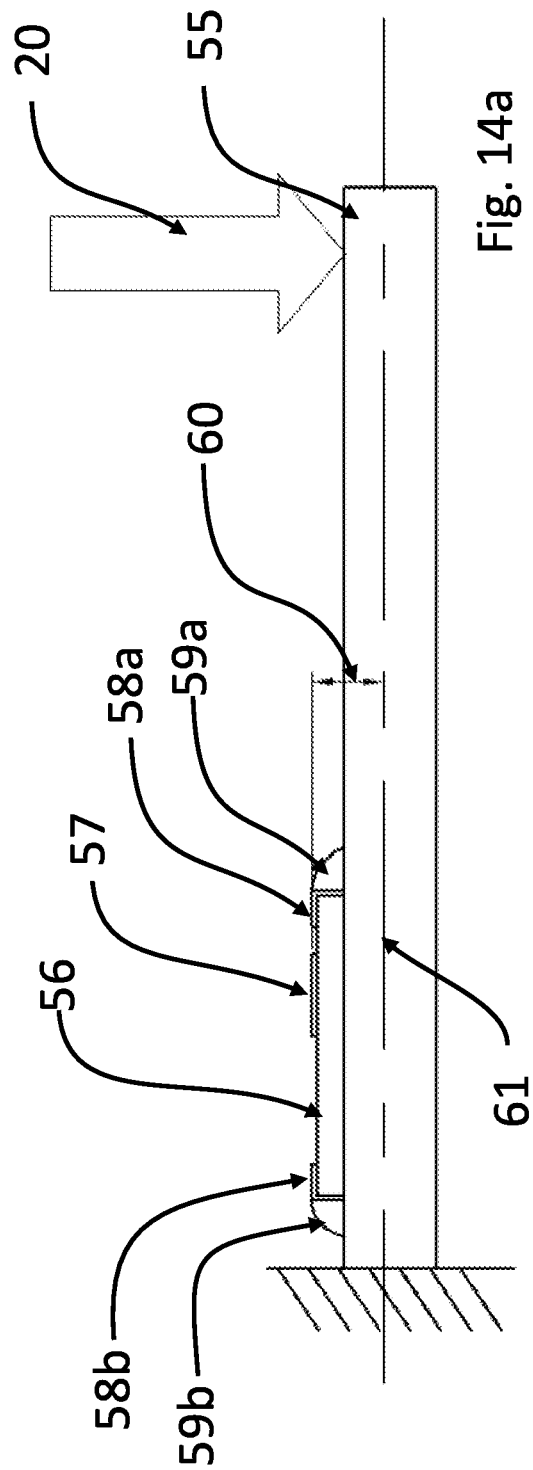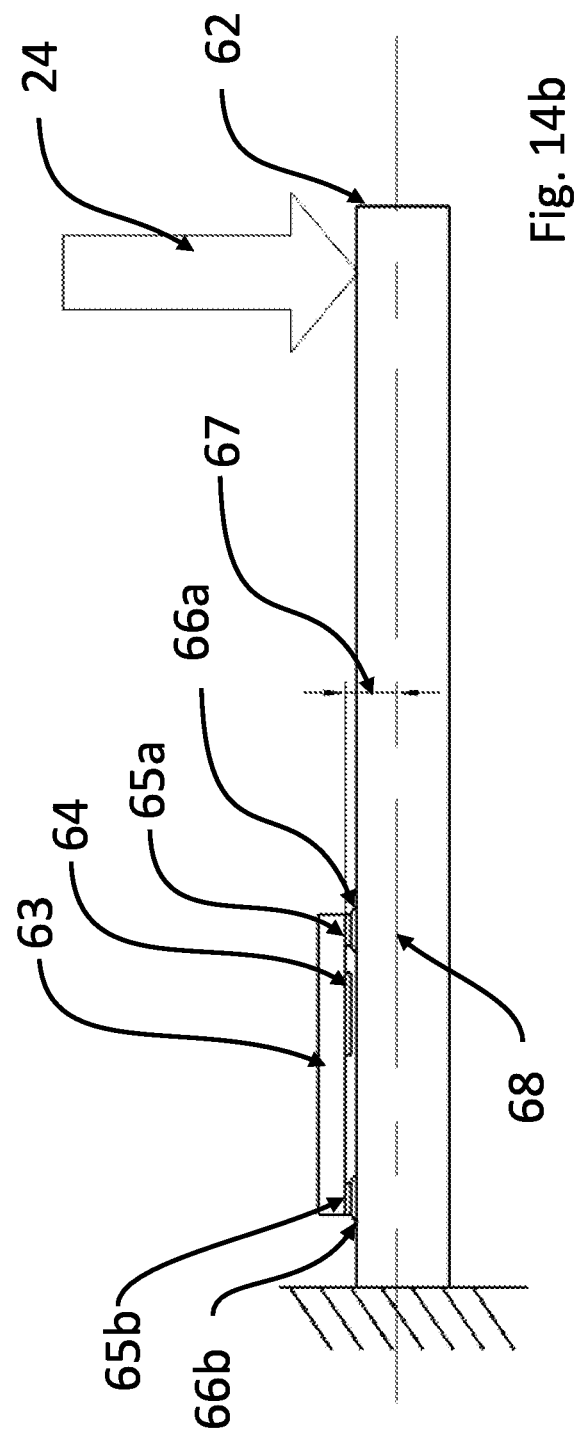

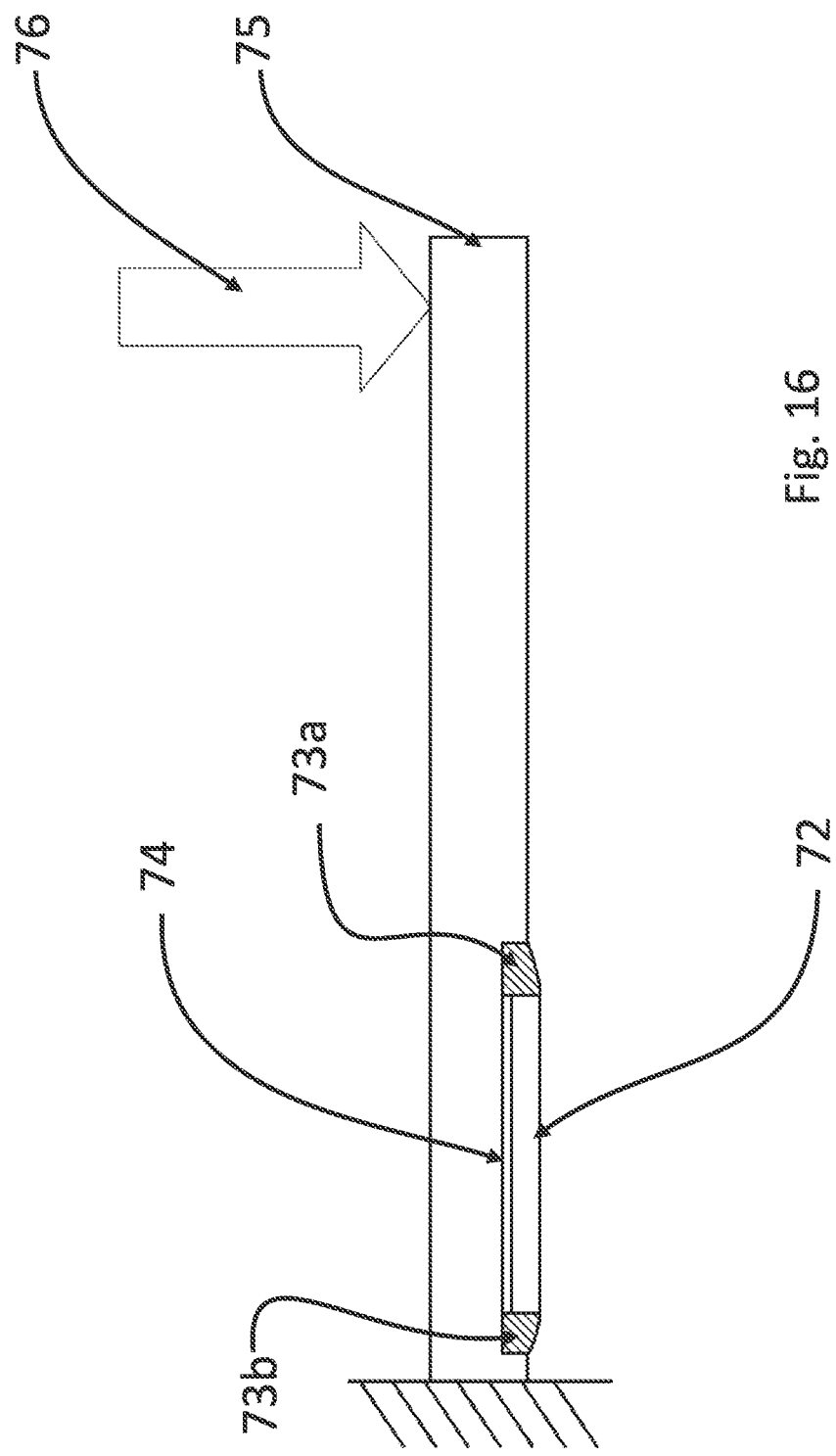

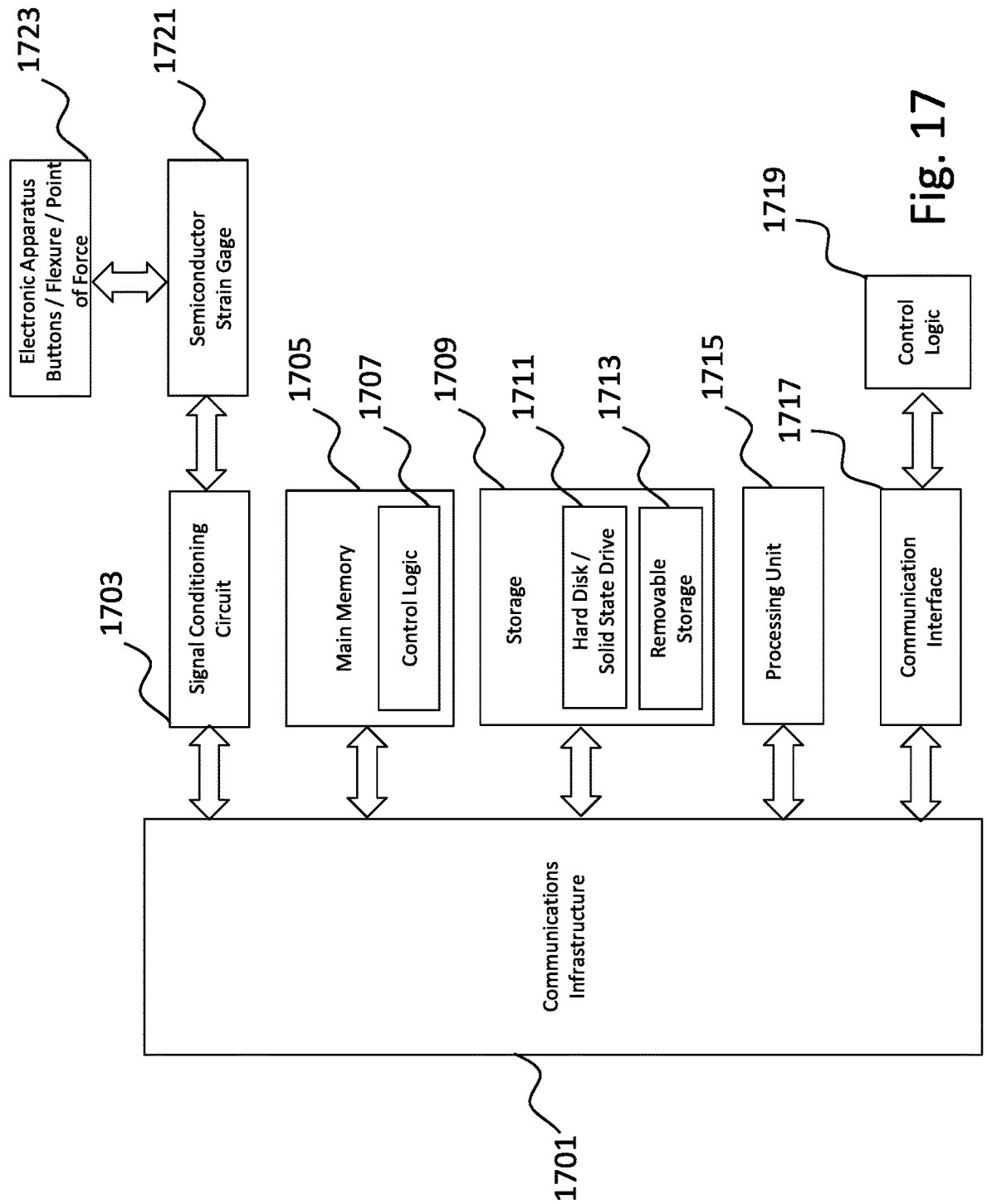

INPUT INTERFACE DEVICE WITH SEMICONDUCTOR STRAIN GAGE

CONTINUATION INFORMATION

This application takes priority from an earlier filed U.S. Provisional Patent Application No. 62/462,491, titled "INPUT INTERFACE WITH SEMICONDUCTOR STRAIN GAGE," filed on Feb. 23, 2017, Jasper Lodewyk Steyn as an inventor. Application No. 62/462,491 is incorporated herein by reference.

COPYRIGHT NOTICE

A portion of the disclosure of this patent document contains material that may be subject to copyright protection. The copyright owner has no objection to the facsimile reproduction by anyone of the patent document or the patent disclosure as it appears in the Patent and Trademark Office patent file or records, but otherwise reserves all copyright rights.

TECHNICAL FIELD

The invention relates to a printed circuit board having a semiconductor strain gage and method of its use. More particularly, the invention relates to transducers and applications where an input, typically though contact force applied on a surface, is converted to an electrical signal for the purposes of enabling control of a device or a component of the device. The invention also relates to a cost-effective, solid-state method for measuring such a force and providing electrical output.

DISCUSSION OF THE RELATED ART

Human interface devices are required for humans to interact with machines so that the machines can operate in a desired manner Examples of interface devices include the switch used to turn on a light bulb, the buttons on a microwave oven, the buttons on the dashboard or the steering wheel of a car, and the buttons and the touch screen on a tablet PC or a cell phone.

When a simple switching operation is desired, the switch is typically a mechanical contact that is either opened or closed as the result of an applied force. One problem with mechanical contacts is that they are prone to mechanical wear and tear, and may be affected by adverse environmental conditions such as humidity or dust.

In other cases, a switching operation can be created by using a variable capacitor connected to an electric circuit. This variable capacitor often relies on the motion of a mechanical membrane and such a membrane can also be prone to wear and fatigue.

In yet another instance one may want to know the location of a press event on a surface. A good example of this is the touch screen of a mobile phone where location of the touch determined the type of action to be taken. Typically, either projected capacitive touch or resistive touch technologies are used in such touch screen applications. While these technologies work well for everyday use, they fail under certain circumstances, for example when the user is wearing gloves or in underwater applications.

To provide an enhanced user experience and additional functionality, it is often beneficial to not only detect the occurrence of a press or touch event, but also to detect the magnitude of the force that was applied, which is often missing in the past applications. The magnitude of the applied force can, for example, be used to control the brightness of a light bulb or it could enable additional functionality on a cellphone touch screen.

Currently, in the art, capacitive techniques are often used to detect the magnitude of the force being applied. Capacitive force sensing relies on measuring the change in the gap between two electrodes, and the output of such a device is by its nature nonlinear. This nonlinearity requires more complex signal processing than what would be required for a linear transducer. The capacitance can also be affected by environmental conditions such as changes in humidity. Furthermore, capacitive techniques typically require two substrates to create a gap that can vary with the applied force, resulting in increased cost of the sensor system. The non-linear nature of the capacitive sensing technique also makes controlling the gap critical, thereby adding additional complexity to the manufacturing of an apparatus that uses capacitive sensing. An apparatus using a capacitive sensing technique may also be more sensitive to drop and shock impacts that could change the gap of the capacitor after manufacturing, resulting in a loss of calibration due to the nonlinear nature of the capacitive sensor.

In other cases, discrete strain gages can be used to measure the force applied to a surface. These strain gages are difficult to install and require additional manufacturing steps that are not commonly available during the manufacturing of electronic circuit boards. These discrete strain gages also require additional signal conditioning circuitry that increase the component count and the cost of the interface device.

In some cases, MEMS force sensors have been used. These sensors can be costly to manufacture, and they also present challenges in the design and assembly of the final product because a fragile micro-fabricated device needs to interact with real-world forces.

SUMMARY OF THE INVENTION

According to the disclosed embodiments, the invention includes an interface device having plurality of components. These components include a semiconductor strain gage, a printed circuit board, with the option of a flexure formed within the printed circuit board, and an associated signal conditioning circuit. The semiconductor strain gage components are mounted in locations where a force can be sensed. In one embodiment, they are mounted adjacent to the flexure formed within the printed circuit board and on top of the printed circuit board.

The structure, as mentioned below, solves the problem of a nonlinear and costly sensor and replaces it with a semiconductor component mounted on a conventional printed circuit board. Since semiconductor strain gages have a very high relative change in resistance for a given strain, also known as the gage factor, they are well-suited to provide a highly sensitive strain sensing solution, as described in the present invention. The high gage factor also means that small strains can produce large outputs. By using small strains, the response of the strain gage will be linear, simplifying the design of the signal conditioning circuit and the signal processing unit.

The strain gages can be manufactured in conjunction with a suitable sensing circuit and an analog-to-digital converter, such that sensing and conditioning can be performed using a single physical component. This configuration therefore allows the designer to use a single component with a digital output, thus simplifying the design and reducing cost.

The interface device includes a strain gage. The strain gage measures strain on a specific area of the printed circuit board. The measurement is converted into an electrical signal and sent for processing. The processing results in the apparatus performing a desired function.

The interface device also includes a printed circuit board. The printed circuit board comprises a plurality of layers, including a conductive layer. The interface device further includes a strain sensing device. The strain sensing device is mounted on the printed circuit board and includes a substrate, a strain sensing element, and associated circuitry. In one embodiment, the strain sensing device can include a piezoresistive strain gage combined with signal conditioning circuitry such that a single electronic component can be mounted on the printed circuit board for reduced cost and improved signal-to-noise performance.

In operation, a user or another device applies a force on the printed circuit board in the area of the strain sensing device. The strain sensitive element deforms, bends or compresses in response to the applied force or strain on the printed circuit board. The deformation results in the change of resistance or conductivity of the strain sensitive element. The associated circuitry, which can be a signal conditioning circuit, converts the change in resistance or conductivity into a digital signal.

Once the conversion occurs, the associated circuitry uses the conductive layer of the printed circuit board to communicate the digital signal to a processing unit (e.g., a processor or a processing circuit) of the electronic apparatus. The processing unit receives the digital signal and responds by performing a desired action.

The strain gage also measures the magnitude of the force exerted. The bending and deformation of the printed circuit board is related to the magnitude of force applied, e.g., a smaller magnitude results in a smaller deformation while a larger magnitude results in a larger deformation. The change of resistance and conductivity of the strain gage is proportional to the strain that is transferred from the printed circuit board to the strain gage and thus proportional to the magnitude of the force.

The processing unit performs an action based on the magnitude of force applied. For example, in a car steering wheel embodiment, the steering wheel includes volume buttons that are attached to the steering wheel for easy access by the driver. In this embodiment, the strain sensing device is used for turning up or down the volume of the car stereo, a lighter finger touch on the volume button, which has a lesser magnitude of force resulting in a smaller deformation, will result in the volume being raised or lowered by one level while a stronger finger push on the volume button, which has a higher magnitude of force, resulting in a bigger deformation, will result in the volume being raised or lowered by multiple levels rapidly.

A distinction between a slower and a faster application of force may also be captured by the processing unit and used to achieve a required modulation of the output such as slower or faster change in the sound volume of a car stereo system.

In another instance the force applied to the touch screen of a cell phone may be sensed by the interface device. In one example, the user may be using a software application for drawing with the cellphone. When a lighter force is applied to the touch screen, a thin line would be drawn by the finger of the user. When a stronger force is applied to the touch screen, a broader line may be drawn, thus achieving a response to increase of force that simulates the behavior of a physical pencil.

BRIEF DESCRIPTION OF THE DRAWINGS

The accompanying drawings are included to provide further understanding of the invention and constitute a part of the specification. The drawings listed below illustrate embodiments of the invention and, together with the description, serve to explain the principles of the invention, as disclosed by the claims and their equivalents.

FIGS. 2C and 2D illustrate a side-by-side comparison of a flexure being bent by two different amounts of force applied to the printed circuit board according to an embodiment of the disclosed subject matter.

FIGS. 6A and 6B illustrate two options for attaching the semiconductor strain gage to the flexure, either with solder or with a glue according to an embodiment of the disclosed subject matter;

FIGS. 7A and 7B illustrate the semiconductor strain gage operating in either a predominantly compressive or tensile mode, where, compressive mode may be preferred to reduce solder joint fatigue according to an embodiment of the disclosed subject matter;

FIGS. 14a and 14b illustrate different mounting configurations for the DSSD in greater detail according to an embodiment of the disclosed subject matter;

FIG. 16 illustrates the semiconductor strain gage attached to a substrate with solder joints where the substrate has a recess and the solder joints are formed in the recess; and FIG. 17 illustrates a computing system used in connection with the semiconductor strain gage according to an embodiment of the disclosed subject matter.

DETAILED DESCRIPTION OF THE PREFERRED EMBODIMENTS

Figure 1:
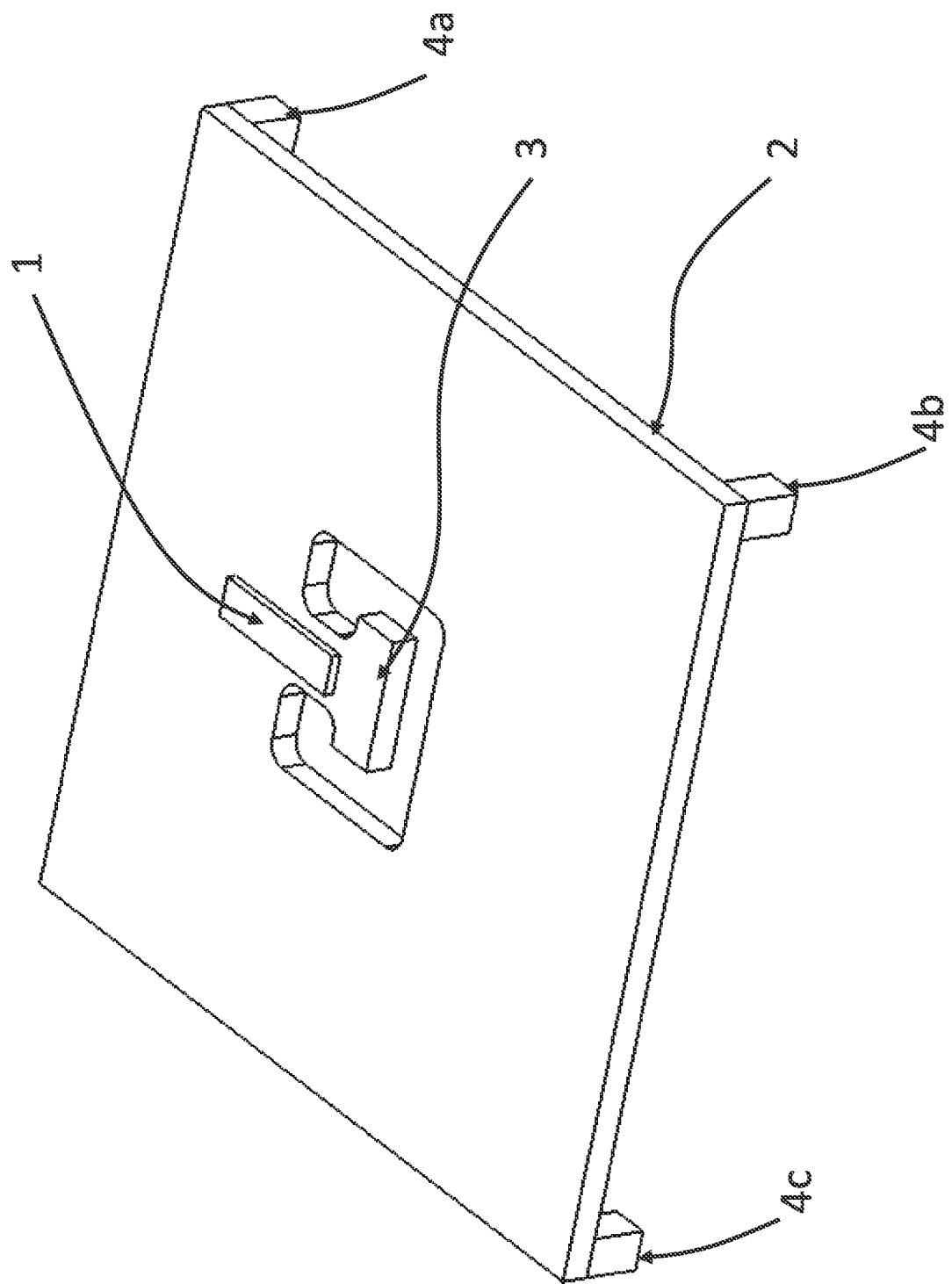
FIG. 1 is an isometric view illustrating the configuration of a semiconductor strain gage mounted on a flexure according to an embodiment of the disclosed subject matter.

Aspects of the invention are disclosed in the accompanying description. Alternate embodiments of the present invention and their equivalents are devised without parting from the spirit or scope of the present invention. It should be noted that like elements disclosed below are indicated by like reference numbers in the drawings. While the embodiments discussed below describe a strain gage, the designs, layouts, and approaches are not so limited and are equally applicable to other strain gage or contact mechanisms that allow a user to engage with an electronic device or component of a mechanical or electronic device through contact.

FIG. 1 is an isometric view illustrating the configuration of a semiconductor strain gage 1 mounted on a flexure 3 formed in a printed circuit board 2 according to an embodiment of the disclosed subject matter.

The semiconductor strain gage 1, printed circuit board 2, flexure 3, and signal conditioning circuitry together form an interface device.

The semiconductor strain gage 1 is attached on top of the printed circuit board 2. Alternatively, it can also be attached on the bottom of the printed circuit board 2. In yet another embodiment, the substrate of the semiconductor strain gage 1 can be formed on the top or bottom of the printed circuit board 2 through standard forming techniques such as chemical or physical vapor deposition or screen printing.

The printed circuit board 2 (PC Board or PCB) is used in electronic devices and apparatuses to structurally support the electronic components, such as resistors, capacitors, processors, and interconnect them such that they may communicate with each other through signal lines connecting one to the other. The electronic components are typically placed on the printed circuit board 2 through soldering or surface mounting using automated machines. Other methods to place electronic components may also be used.

The printed circuit board 2 can have one or many layers. A single-layer printed circuit board 2 implies that it only has one routing layer and all the electronic components are placed on that layer and connected within that layer. Its construction includes coating one side with a thin layer of copper, etching the copper and then typically a solder mask for ease of manufacturing and a silk-screen for nomenclature are applied.

Alternatively, the printed circuit board 2 can be a double sided or a multi-layer PCB. Its construction includes coating of copper to both sides of the board and drilling perforations though the board from circuits on one side of the board to connect with circuits on the other side. In the case of multi-layer boards, several routing layers are laminated together. Other alternative constructions of printed circuit boards are also contemplated to be used with this invention.

The printed circuit board 2 has an area carved out to form a flexure 3. The flexure 3 is essentially the same substrate of the printed circuit board and provides an area for concentrated strain. In one embodiment, the flexure 3 is similar to a cantilever beam which bends when a force is applied onto it. The flexure 3 may also be formed in other shapes and sizes. The positioning of the flexure 3 is such that there is some space or clearance underneath or above the flexure 3. This clearance allows space for the flexure 3 to bend when a force is applied in either direction.

In one embodiment, a force between 1N and 10N is applied to the flexure 3 of the printed circuit board 2. A custom flexure and printed circuit board may be designed to receive this magnitude of force. For example, a flexure with a length of between 2 mm and 10 mm and a PC Board thickness of between 0.2 mm and 2 mm can be designed to have a maximum strain of a few hundred microstrain that can readily be sensed by a semiconductor strain gage.

Figure 2A:
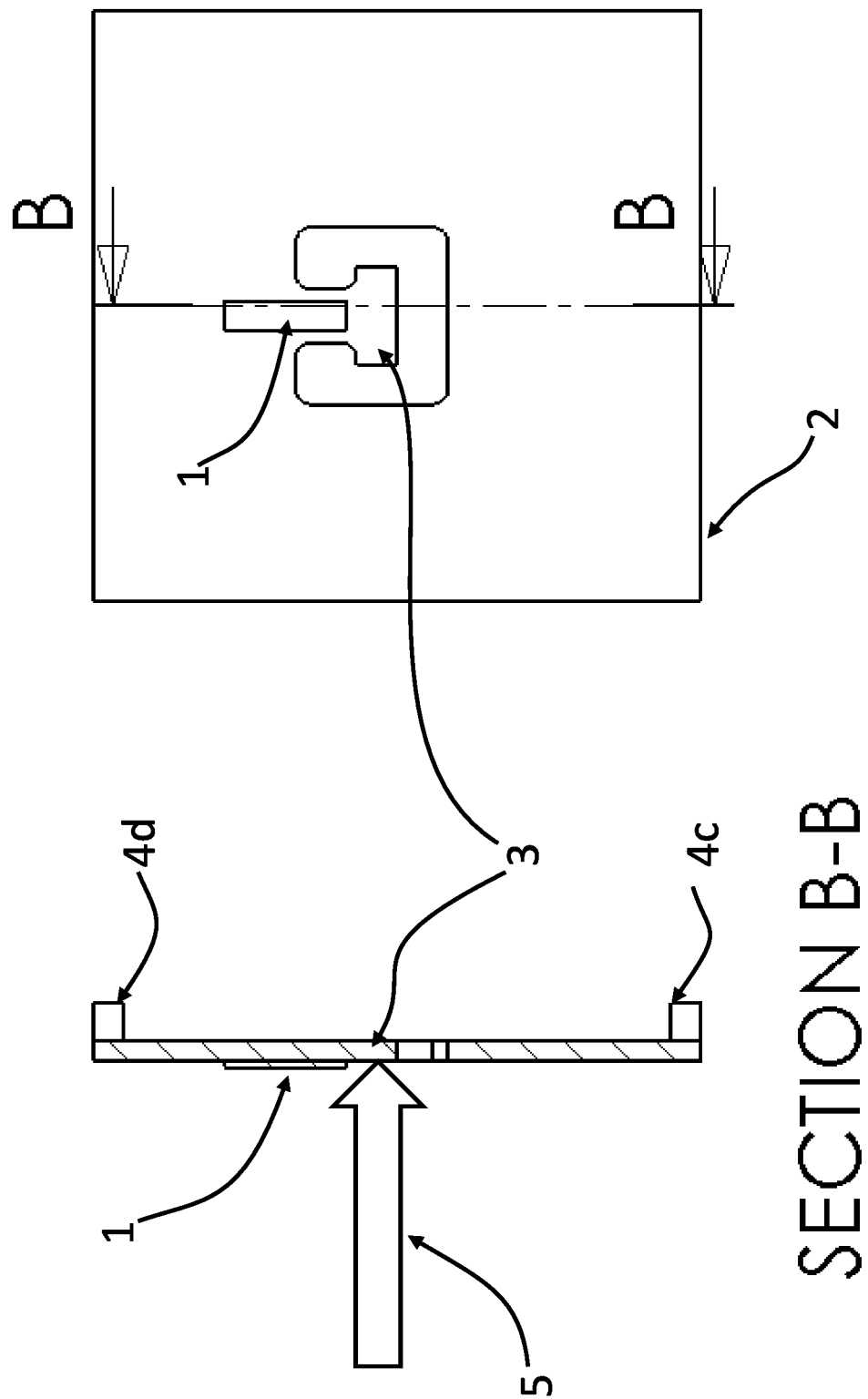
FIG. 2A illustrates a cross-sectional view of the semiconductor strain gage mounted on a flexure in the printed circuit board according to an embodiment of the disclosed subject matter.

A plurality of posts or standoffs structurally support the printed circuit board 2. In one embodiment, the printed circuit board 2 is supported by standoffs 4a, 4b, 4c, as well as 4d as shown in FIG. 2a. The number of standoffs used will depend on each particular design, and the standoffs or supports will be sufficient to hold the PC board 2 in place and allow for bending of the flexure of the printed circuit board 2.

According to the disclosed embodiment, the printed circuit board 2 includes a specific area or a region, i.e. the flexure, where a force is to be applied. For example, if the printed circuit board is part of an electronic apparatus, such as a household appliance such as a microwave oven, dishwasher, washing machine that has push or action buttons or a marked area for the user to push, such as a power button, or a cycle of operation button, or if the printed circuit board is part of a machinery or an automobile feature, the specific region of the printed circuit board, i.e. the flexure, where the force is to be applied will be located underneath the action buttons or marked area where the user will be pressing on the appliance for a certain operation.

In other cases, the flexure may be positioned at a different location from the location where the force is applied. One example would be in the case of a cell phone touch screen, where the force can be applied anywhere on the touch screen area but the force sensing elements would only be in a few select locations.

One may also use multiple force sensors to sense the input to a joystick or a toggle, as is commonly used on an automotive steering wheel.

Once the force, either through the user's finger, or other methods is applied to the free end of the flexure in the printed circuit board 2, the flexure in the printed circuit board will bend in response to the force applied.

FIG. 2a illustrates a cross-sectional view of the semiconductor strain gage mounted on the printed circuit board and the flexure formed within the printed circuit board according to an embodiment of the disclosed subject matter. The cross section further depicts the details of the location where a user may press their finger and apply a force to the flexure. FIG. 2A shows a top and side view of the configuration in FIG. 1. Section B-B in FIG. 2a shows a force 5 applied to flexure 3. Force 5 can be the result of a finger pressing on the PC board 2, or the force can be transferred to the PC board via another device such as a stylus or a coupler such as a mechanical, electro-mechanical, pneumatic or hydraulic device. The force 5 may be continuous yet have different levels of intensity. Alternatively, force 5 may be a series of pressure actions against flexure 3.

Figure 2B:
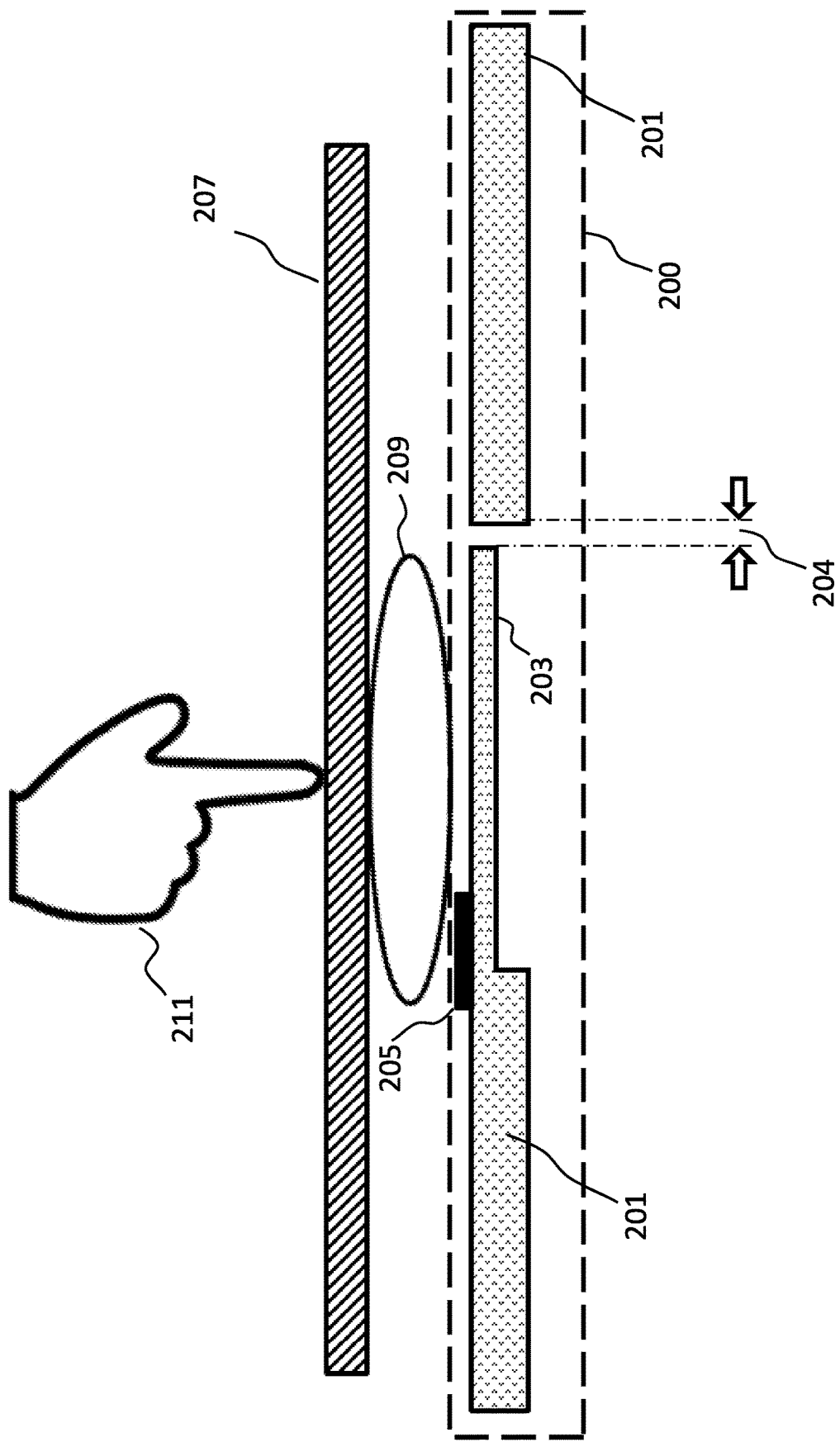
FIG. 2B illustrates an interface device fitted in an electronic apparatus with a housing with a force applied by a finger according to an embodiment of the disclosed subject matter.

FIG. 2B illustrates the deformation of the printed circuit board when a force is applied according to an embodiment of the disclosed subject matter.

In this embodiment, an interface device 200 includes a printed circuit board 201, a flexure 203 formed within the printed circuit board 201, and a semiconductor strain gage 205 mounted on the printed circuit board. In some instances, the strain sensing device includes one semiconductor strain gage and in other instances multiple semiconductor strain gages can also be used. The flexure 203 includes gaps or clearances 204 on some of its sides and either underneath or above. These gaps and clearances allow the flexure to bend when a force from the finger is applied.

The interface device 200 also includes a signal conditioning circuit (not shown). The interface device 200 is covered externally with a housing 207 of an electronic apparatus. In one example, the apparatus is a household microwave oven that has push buttons 209 for heating food that may be placed inside the microwave oven. The external housing area where the force from a user's finger 211 is applied may be a push button 209, some type of indentation, protrusion, or simply marked as an area for applying touch or force.

The force, in the case of a microwave oven, would be a finger pushing on a button 209. For example, the button 209 pushed could be for a 1-minute heat to be applied to the food. When the user presses their finger 211 on the push button 209, the interface device, which sits hidden underneath the button measures the deformation or bending of the flexure 203 on the printed circuit board 201 caused by the force applied by the finger. The deformation or bending causes a change in the resistance or conductivity of the semiconductor strain gage 205. The interface device 200, which includes a signal conditioning circuit, converts the change in resistance or conductivity into an analog output and a then a digital output. The output is then communicated to either a processor or a processing circuit of the microwave oven. The output is processed and in response the microwave oven is turned on to heat the food inside it for 1-minute.

FIGS. 2C and 2D illustrate a side-by-side comparison of a flexure being bent by two different amounts of force applied to the printed circuit board according to an embodiment of the disclosed subject matter. An apparatus having a printed circuit board 251, a flexure 253 attached to the printed circuit board, and a push button 255 of the apparatus is disclosed in both FIGS. 2C and 2D. The amount of force applied in FIG. 2C is less than the amount of force applied in FIG. 2D. As such, the bending 257 of the flexure 253 in FIG. 2C is less as compared to the bending 259 in FIG. 2D. The semiconductor strain gage measures the amount of bending, which correlates to the amount of force applied, and translates it to a change in resistance or conductivity. The change in resistance or conductivity for bending 257 of FIG. 2C is less than the change in resistance and conductivity for bending 259 of FIG. 2D. A digital signal is generated by an analog-to-digital converter circuitry associated with the semiconductor strain gage. The digital signal is then used by the processing unit to cause the electronic apparatus to perform a function. The apparatus may be programmed to perform a different function for a lesser force than the function that is to be performed if a higher force is exerted.

An example of FIGS. 2C and 2D, i.e., force sensing ability of the invention can be explained in an automobile setting. In this scenario, the interface device 203 may be located in an automobile for controlling certain features of the automobile, such as a volume control button that is located in the steering wheel of the automobile. Typically, audio buttons are located on the steering wheel for the driver's ease of use such that the driver can control the volume of the stereo in the car without having to take their hands or eyes of the road.

The volume control button uses a push button technology that when pushed activates the semiconductor strain gage that may be located underneath the push button. The current inventions determine the amount of force used to push the volume button and responds accordingly. If a volume button is pushed with minimal or a lighter force, then the volume on the stereo may go up one level or go up in volume at a slower rate as opposed to it being pushed with a higher force which may result in the volume going up multiple levels or increasing volume at a more rapid rate. For example, if the push with lesser force would increase the volume from the lowest to the highest volume in 3 seconds, then a stronger push would accelerate that to 1 second or less. In operation, depending upon the amount of force applied to the volume button, the deformation of the semiconductor strain gage and the change of resistance would determine the rate of change in volume, based on the amount of force applied.

In another instance the interface device may be used to measure the magnitude of the force applied by a finger pressing on the touch screen of an electronic apparatus such as a cellular phone. The magnitude of the applied force can then be used to control the operation of the cellular phone. A high magnitude force can cause the apparatus to operate in one way, whereas a low magnitude force can cause the apparatus to operate in another way.

Although a microwave oven, an automobile, and a touch screen are used as examples, other devices, electronic apparatuses, and components that allow application of force or touch to operate are also contemplated. The force in this instance, a finger push, was a pointed force, however, other types of forces such as distributed force, force applied through machines and other mechanisms, uniform or non-uniform force is also contemplated by the invention.

Additionally, the above example depicts the deformation of the printed circuit board when a force is applied.

Figure 3:
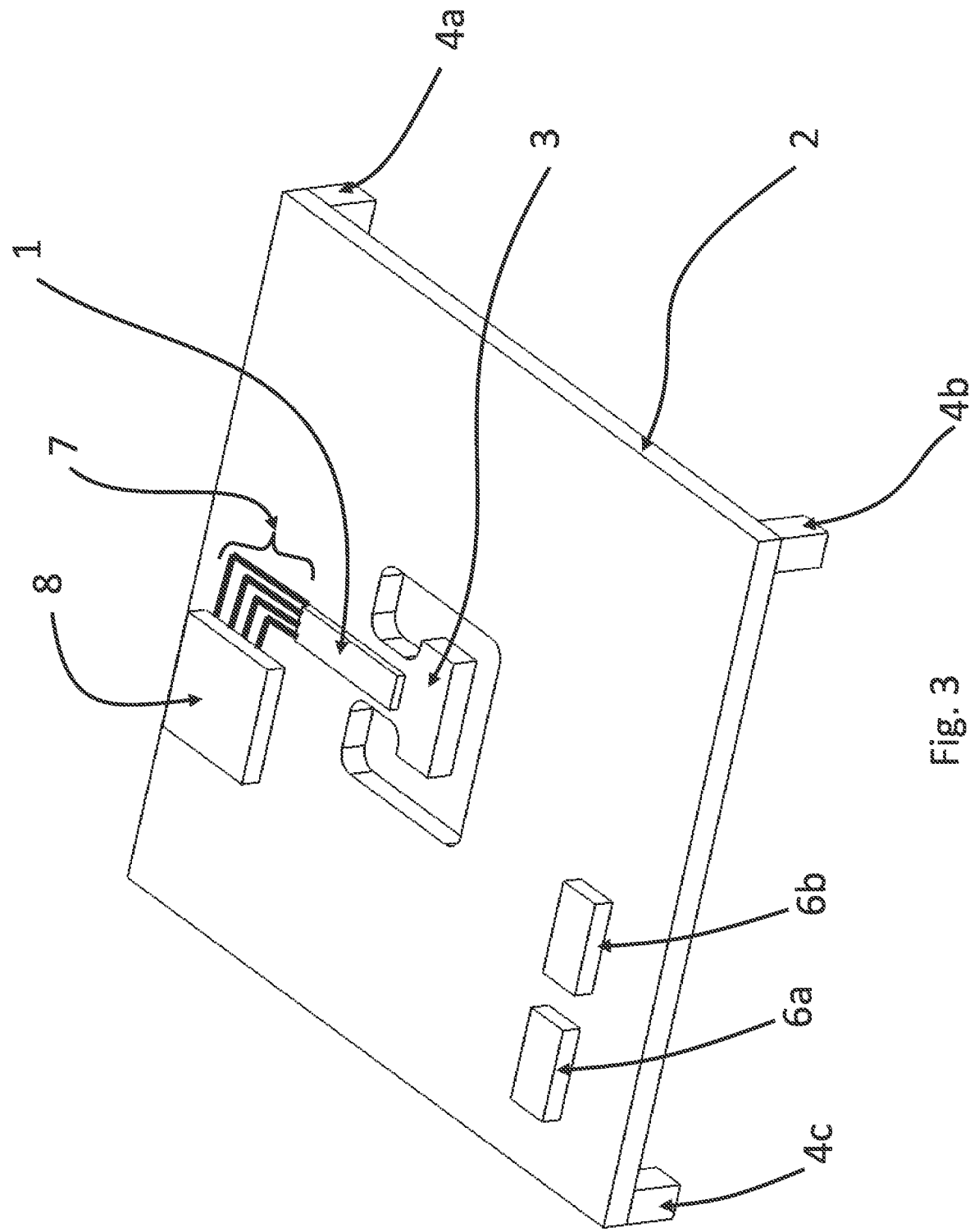
FIG. 3 illustrates an isometric view of a semiconductor strain gage mounted on a flexure in a printed circuit board, and connected to a separate signal conditioning integrated circuit according to an embodiment of the disclosed subject matter.

FIG. 3 adds further detail to the configuration introduced in FIG. 1. The strain gage 1 may be mounted on PC board 2 and connected to a signal conditioning integrated circuit (IC) 8 with a set of connection wires 7. There will often be several other components on the PC board 2, shown here as 6A and 6B. These components can include resistors, capacitors, inductors and other ICs, and the like.

A strain gage is a device that exhibits a change in electrical properties when subjected to a deformation. Two common types of strain gages are metal foil strain gages and piezoresistive semiconductor strain gages. For a metal foil strain gage, a metal resistive film is attached to the surface where in the strain needs to be measured. As the surface deforms, the metal film either lengthens or contracts. This change in length may result in a small change in the internal crystalline structure of the metal, thereby resulting in a change in resistance. This change in resistance can be detected by suitable signal conditioning circuitry, shown as signal conditioning integrated circuit (IC) 8.

The signal conditioning integrated circuit 8 is communicatively connected to the semiconductor strain gage 1. The signal conditioning circuit 8 is also communicatively connected to a processor or a processing circuit (not shown in figure). In operation, the semiconductor strain gage 1 measures strain on the flexure 3 and converts the strain or applied force on the flexure into an electrical signal or change in resistance. The signal conditioning circuit converts this change of resistance into an analog output. This analog output is then converted into a digital output using an analog-to-digital converter.

The signal conditioning circuit 8 may contain a Wheatstone Bridge circuit. If a Wheatstone bridge circuit is used, the semiconductor strain gage 1 may form one branch of the Wheatstone bridge circuit. In operation, the Wheatstone bridge circuit would receive an input voltage and then produce an amplified output that is reflective of the strain detected. For increased sensitivity, multiple semiconductor strain gages may also be used to sense the strain and form multiple branches of the Wheatstone bridge circuit. The analog part of the signal conditioning circuit may also include components such as operational amplifiers, transistors and passive components such as resistors and capacitors, such as 6a and 6b.

Figure 4:
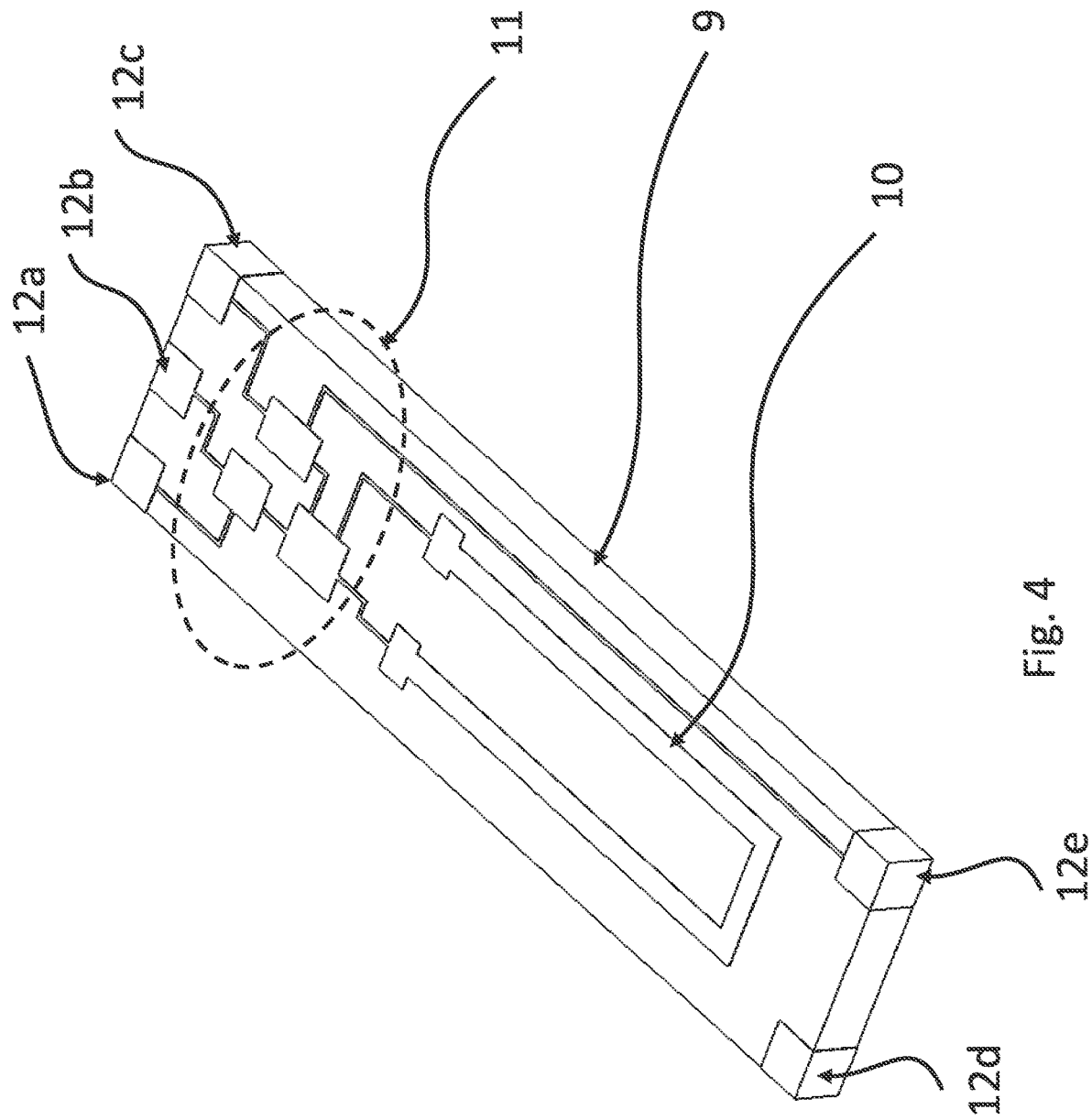
FIG. 4 illustrates an isometric view of a semiconductor strain gage with integrated signal conditioning circuitry on the same substrate according to an embodiment of the disclosed subject matter.

FIG. 4 is an isometric view of a semiconductor strain gage 10 combined with integrated signal conditioning and analog-to-digital (A/D) circuitry 11. Semiconductor piezoresistive strain gages are formed in materials such as silicon and gallium arsenide. When stress is applied to the semiconductor, the crystalline structure of the semiconductor will change slightly. As a result, the conductivity of the semiconductor will change. Small changes in the crystalline structure may result in very large changes in conductivity. The gage factor is defined as the ratio of the fractional change in resistance over the fractional change in length. The fractional change in length also may be called the strain. The gage factor is an indication of the sensitivity of a strain gage. A metal foil strain gage, as disclosed above, may have a gage factor between 1 and 4. Semiconductor strain gages may have gage factors between 100 and 200. Thus, semiconductor strain gages may be significantly more sensitive than metal foil strain gages. This feature allows semiconductor strain gages to measure smaller strains and provide a better signal to noise ratio. Other types of strain gages may include piezoelectric strain gages, carbon nanotube-based strain gages, nanoparticle-based strain gages, and nanowire-based strain gages.

Figure 5:
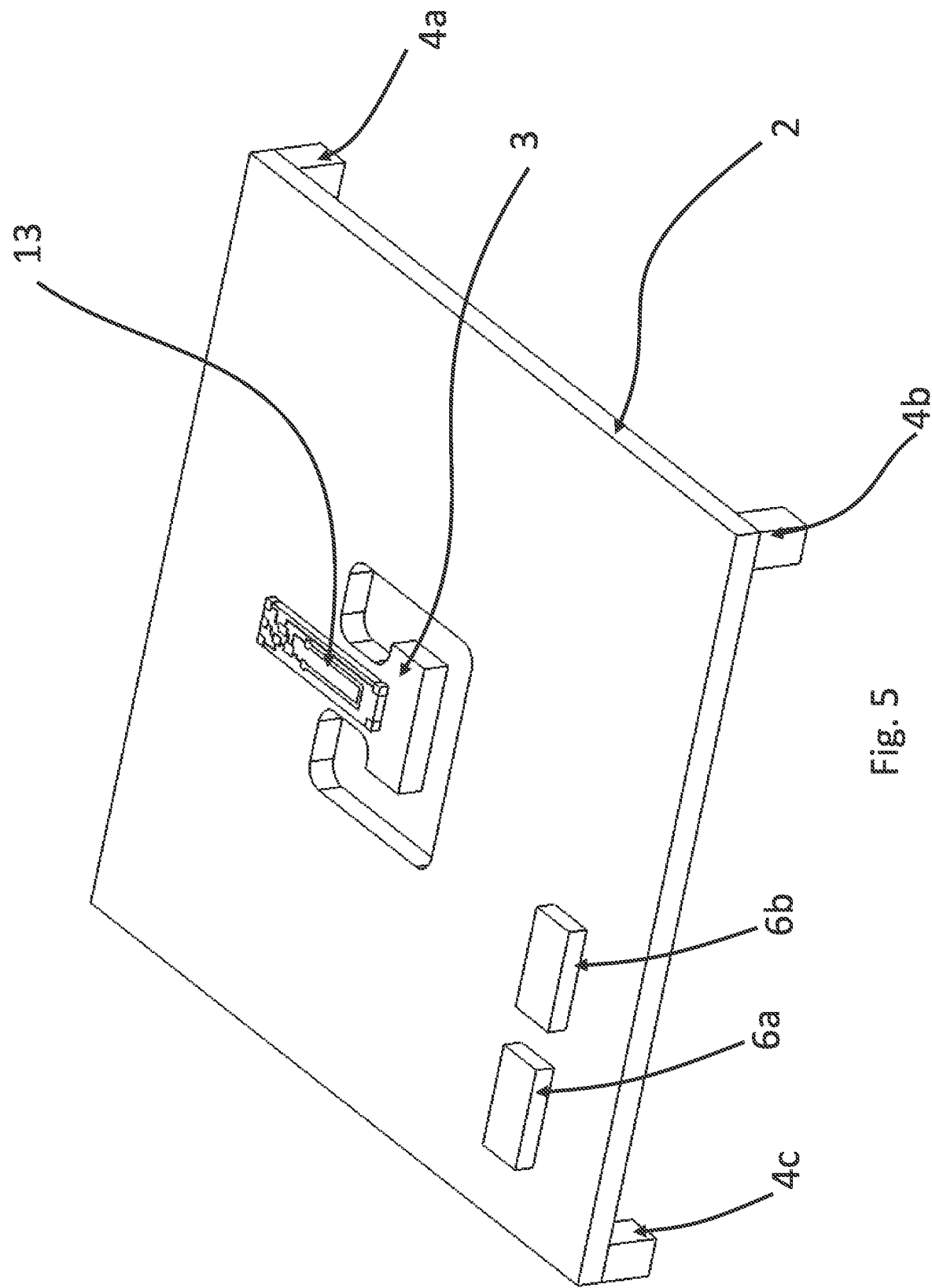
FIG. 5 illustrates a simplification of FIG. 3 as a result of using integrated signal conditioning according to an embodiment of the disclosed subject matter.

The strain gage may be part of a digital strain sensing device (DSSD), shown as DSSD 13 in FIG. 5. FIG. 4 shows that it is comprised of a silicon substrate 9, a strain sensing piezoresistor 10, signal conditioning and A/D electronics 11, and bond pads 12d-12e. The DSSD is manufactured using semiconductor processing techniques such as diffusion, ion implantation, metal deposition, metal etching, dielectric deposition and dielectric etching. The substrate 9 may be thinned after fabrication such that the piezoresistor 10 will experience more strain for a given applied force, and provide a better output signal to circuitry 11. Typically, the plurality of bond pads 12a-12e will allow for connection of a power supply line, a ground line, and one or more signal output lines to strain gage 1. The digital output of the DSSD can be either serial or parallel. In most cases, serial output would be preferred due to the requirement for less output terminals.

Typically, substrate 9 would be attached to a structure that would deform or bend when a force is exerted on it. An example of such a configuration is shown in FIG. 5, wherein DSSD 13 is attached to a structure, or PC board 2. An electric potential is applied across the ends of piezoresistor 10. When the free end of flexure 3 on PC board 2 is pressed, substrate 9 lengthens or shortens depending on the direction of the applied force. When substrate 9 changes length, the conductivity of piezoresistor 10 will change. A change in current is detected by the integrated signal conditioning circuit 11. As the force increases, substrate 9 deforms piezoresistor 10 even further, thereby causing a greater change in resistance. As a result, different applied forces will result in different lengths of substrate 9. In turn, different applied forces change the conductivity of piezoresistor 10 by different amounts.

FIG. 5 describes a configuration wherein FIG. 3's signal conditioning IC 8, connecting wires 7 and strain gage 1 are removed and replaced with the DSSD 13, as shown in detail in FIG. 4. The embodiment in FIG. 5 will have a lower manufacturing cost than the embodiment shown in FIG. 3 due to less components being used on PC board 2 (FIG. 3). Furthermore, by having the signal conditioning and A/D circuitry in close proximity to the diffused piezoresistor 10, less electromagnetic noise will be experienced, thereby resulting in a more sensitive force sensor.

Historically, strain gages were used in industrial applications or for performing engineering analyses of structures. In these applications, the cost of the additional signal conditioning circuitry, or connecting lines 7 and signal conditioning IC 8 of FIG. 3, were not a major consideration because this cost was small compared to the overall cost of the final product. In recent years, this condition has changed. In consumer devices that use discrete strain gages, the reduction in the number of components on a PC board may result in substantial cost savings in mass production. This aspect of a reduced number of components may be seen in FIG. 5 when compared to FIG. 3. The integration of circuitry with the strain gage on the same die presents some challenges, which are addressed below.

Referring back to FIG. 4, substrate 9 should be thin enough so it can stretch or contract as a result of the applied deformation of base substrate 2. Therefore, wafer thinning may be required. Semiconductor wafers are between 300 and 1000 micrometers thick during fabrication. For a strain gage to be effective, the thickness of substrate 9 in FIG. 4 should be less than 400 micrometers, but still thick enough to be robust during manufacturing. A thickness of at least 50 micrometers is desirable to ensure the device shown in FIG. 4 will be robust enough. A thicker device may be needed if the device is to be used in a compressive stress configuration, as shown in FIG. 7b below. Circuit boards of various thicknesses that may undergo different types of deformations, such as bending, expanding are also contemplated in the invention.

A tradeoff with using a semiconductor strain gage as opposed to a metal foil strain gage is that semiconductor substrate 9 may be a brittle material, such as silicon, gallium arsenide, quartz, or low sodium glass. Thus, care needs to be taken to ensure that the device is not subjected to undue stress during mounting on the PC board. Some methods for mounting the DSSD to the board are described below.

It is important that the DSSD 13 be securely attached to the PC board 2. The strain that the PC board will experience due to an applied force 5 needs to be transferred to the DSSD so that an electrical output corresponding to the applied force may be generated. There are several techniques available to attach the strain gage to the PC board. FIG. 6 describes two methods for attaching the DSSD to the PC board. FIG. 6a is a side view of a DSSD 14 attached to PC board cantilever 16 with free end 40 and anchored end 41. The DSSD 14 is attached with solder in the region where it would experience substantially the greatest strain when PC board cantilever 16 is subjected to a force in the vicinity of free end 40. The solder joints 15a and 15b can be formed by conventional soldering or by the more typical reflow soldering, as is typically used in mass production.

FIG. 6b is a side view a DSSD 17 attached to PC board cantilever 16 using a glue bond 18. This glue bond 18 can be an epoxy, a thermoset or an anisotropically conducting film (ACF). If an ACF is used, the ACF can also provide electrical connection to the bond pads of the DSSD 17.

Typically, a printed circuit board that uses the solder joint will experience some fatigue over time. Applying continuous or cyclic strain from vibration, thermal expansion and bending or application of force may cause cracks, fatigue, and failure of the solder joints. Additional issues, such as overloading the solder joint and corrosion may also add to the failures.

Because the DSSD will be subjected to strain, the solder or glue bonds used to attach the DSSD will also experience strain and stresses. Over many cycles, the bonds may experience fatigue as mentioned above. Fatigue may result in breakage or lack of functionality of the strain gage and ultimately result in an improper connection between electronic components or in-operation of the electronic apparatus due to a failure of a solder joint.

Fatigue issues can be mitigated by appropriate placement of the DSSD. FIG. 7 shows two options for mounting the DSSD on a PC Board. In FIG. 7A, the DSSD 14 is mounted in such a way that the solder bonds 15a and 15b will experience predominantly tensile stresses when the PC board cantilever is subjected to force 20 applied in the direction shown by the arrow. In FIG. 7B, the DSSD 21 is mounted in such a way that the solder bonds 22a and 22b will experience predominantly compressive stresses when the PC board cantilever is subjected to force 24 applied in the direction shown by the arrow. Materials often exhibit better fatigue life when subjected to cyclic compressive loads vs. cyclic tensile loads, and therefore the configuration in FIG. 7b may be preferred.

Figure 8:
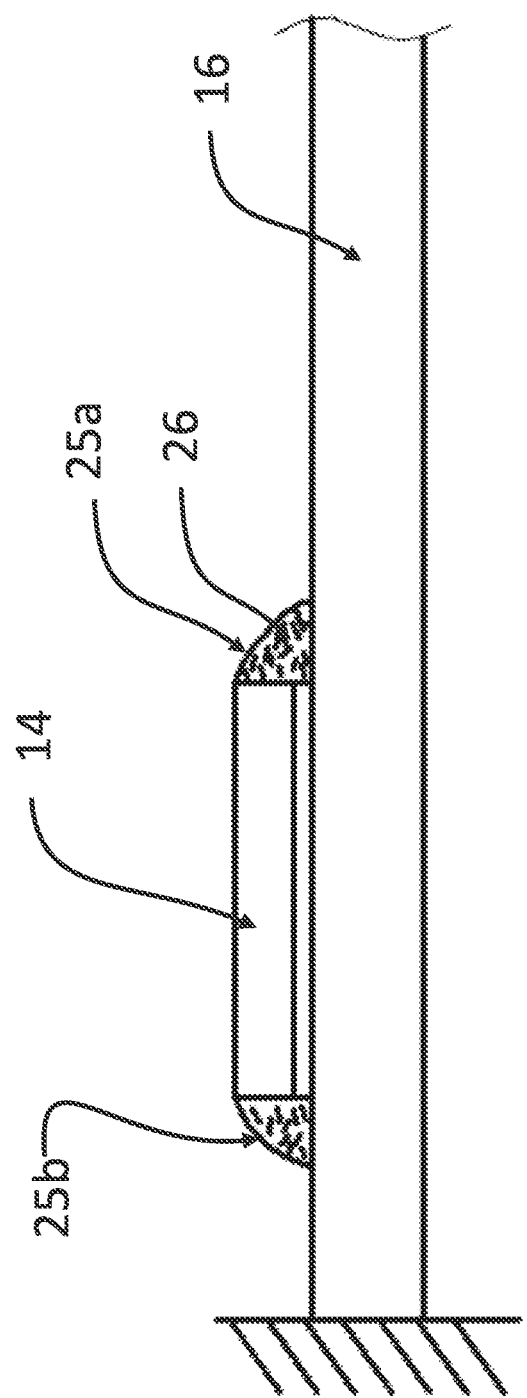
FIG. 8 illustrates the semiconductor strain gage attached to a substrate with composite solder to improve fatigue life according to an embodiment of the disclosed subject matter.

FIG. 8 shows another technique for overcoming fatigue issues related to solder bond attachment. In FIG. 8, a section of a PC board cantilever 16 includes DSSD 14 attached using solder connections 25a and 25b. The solder used is filled with a filler material 26. The filler material 26 can be a combination of carbon nanotubes, carbon fibers, carbon spheres, ceramic spheres, ceramic fibers, ceramic nanowires, metal fibers or metal nanowires. The filler material 26 will help to prevent crack initiation as well a crack propagation due to cyclic loading of the solder joints.

Figure 9:
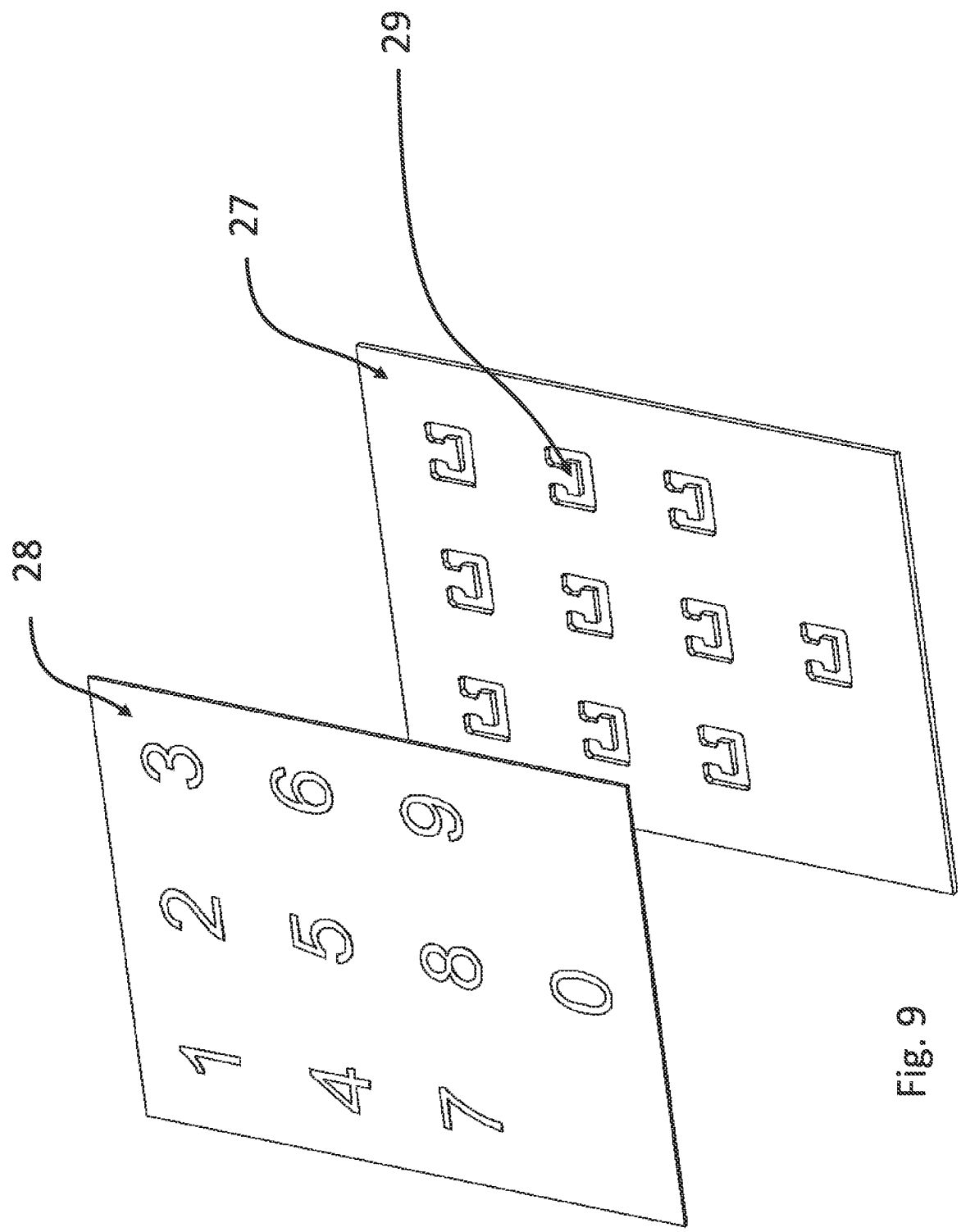
FIG. 9 illustrates an array of flexures formed on a printed circuit board to form a simple solid-state key pad according to an embodiment of the disclosed subject matter.

The basic structure of a DSSD mounted on a PC Board can be used in various applications. FIG. 9 shows an array of flexures 29 formed on PC board 27 to make a simple 10-digit keypad. Keypad membrane 28 is coupled to PC board 27. As the user presses on a number on membrane 28, the flexure 29 underneath that number would deflect so that a strain can be sensed using a DSSD, as disclosed above.

Figure 10:
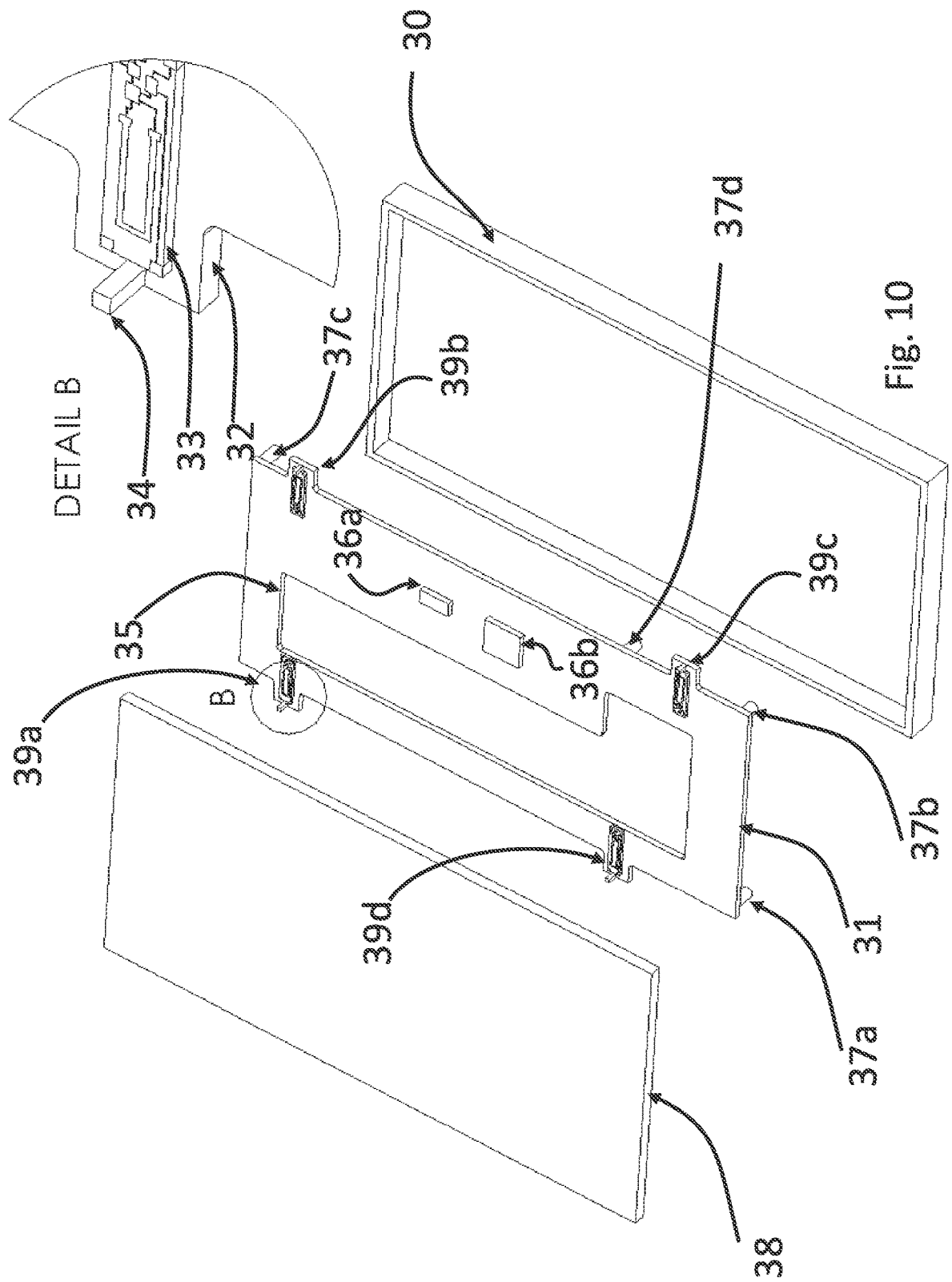
FIG. 10 illustrates four semiconductor strain gages attached to the main board of a mobile device (e.g. a cell phone) to provide force as well as position information according to an embodiment of the disclosed subject matter.

FIG. 10 shows how a DSSD can be used to provide force sensing of the touch screen of a mobile device such a cell phone or a tablet. In FIG. 10, DSSD 33 is attached to PC board 31 in four locations to form four force sensing subassemblies 39a-39d. Display subassembly 38 connects to four flexures 32 via connection members 34. PC board 31 will also have several other electronic components such as 36a and 36b mounted on it. PC board 31 is mounted to housing 30 with attachment elements 37a-37d.

The attachment elements will provide sufficient support for the PC board so that the flexures can bend when a force is applied to display subassembly 38. The force is subsequently measured using the force sensing subassemblies 39a-39d. By placing multiple force sensing subassemblies on PC board 31, it is also possible to infer the location where the user presses on display subassembly 38. This position information may be used to augment or replace the existing capacitive or resistive touch location and force sensing incorporated in the display subassembly and may enable applications where conventional touch sensing does not work, e.g. underwater applications or in applications where the user wears gloves.

When incorporating circuitry onto the same substrate as the strain sensor, a risk exists that the sense circuitry may be subjected to stresses and strains. The integrated components in those circuits, such as resistors, capacitors, transistors, and the like, also may have slight changes in properties. This issue may be overcome by using two methods. In one instance, care can be taken to orient sensitive devices in the sense and signal conditioning circuitry 11 shown in FIG. 4 in such way that any strain imparted on such device will have a minimal effect on the resistance value of a resistor or the conductivity of the channel of a transistor, and the like.

Figure 12:
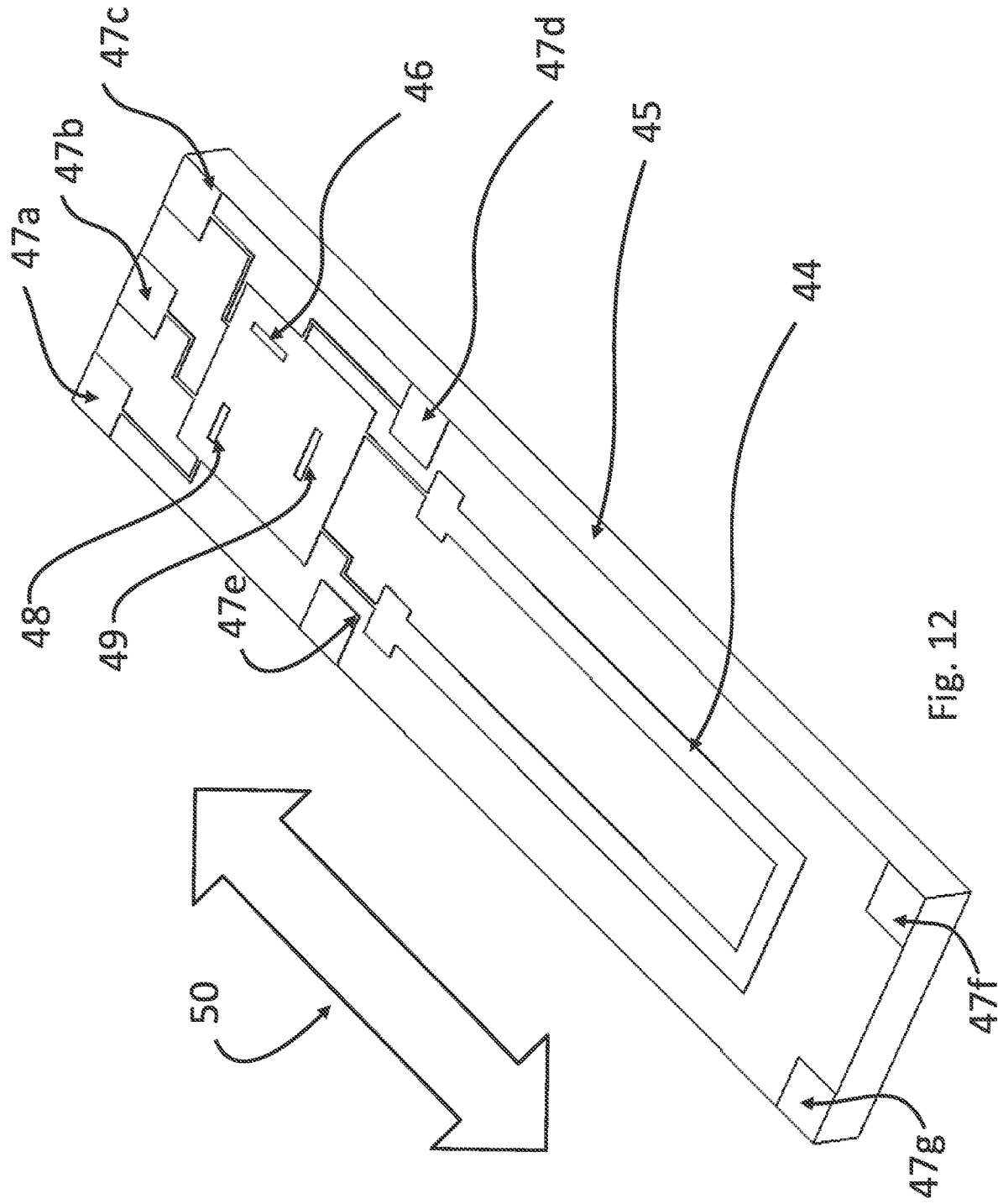
FIG. 12 illustrates an example of a digital strain sensing device (DSSD) showing detail of some of the devices that form part of the signal conditioning circuitry of FIG. 4 according to an embodiment of the disclosed subject matter.

FIG. 12 shows an example of a DSSD showing detail of some of the devices that form part of signal conditioning circuitry 11 in FIG. 4. Channel 48 of a transistor may be shown along with semiconductor resistors 46 and 49. Arrow 50 represents the direction of extension or contraction. In other words, arrow 50 refers to the direction of strain and the bending of the substrate. If the strain occurs in the direction indicated by arrow 50, then strain gage 44 and resistor 46 will have a greater change in resistance due to the strain applied by the force because they are oriented along the direction of the strain. Channel 48 and resistor 49 are oriented perpendicular to the direction of strain and will be less sensitive to variations induced by the strain.

Figure 13:
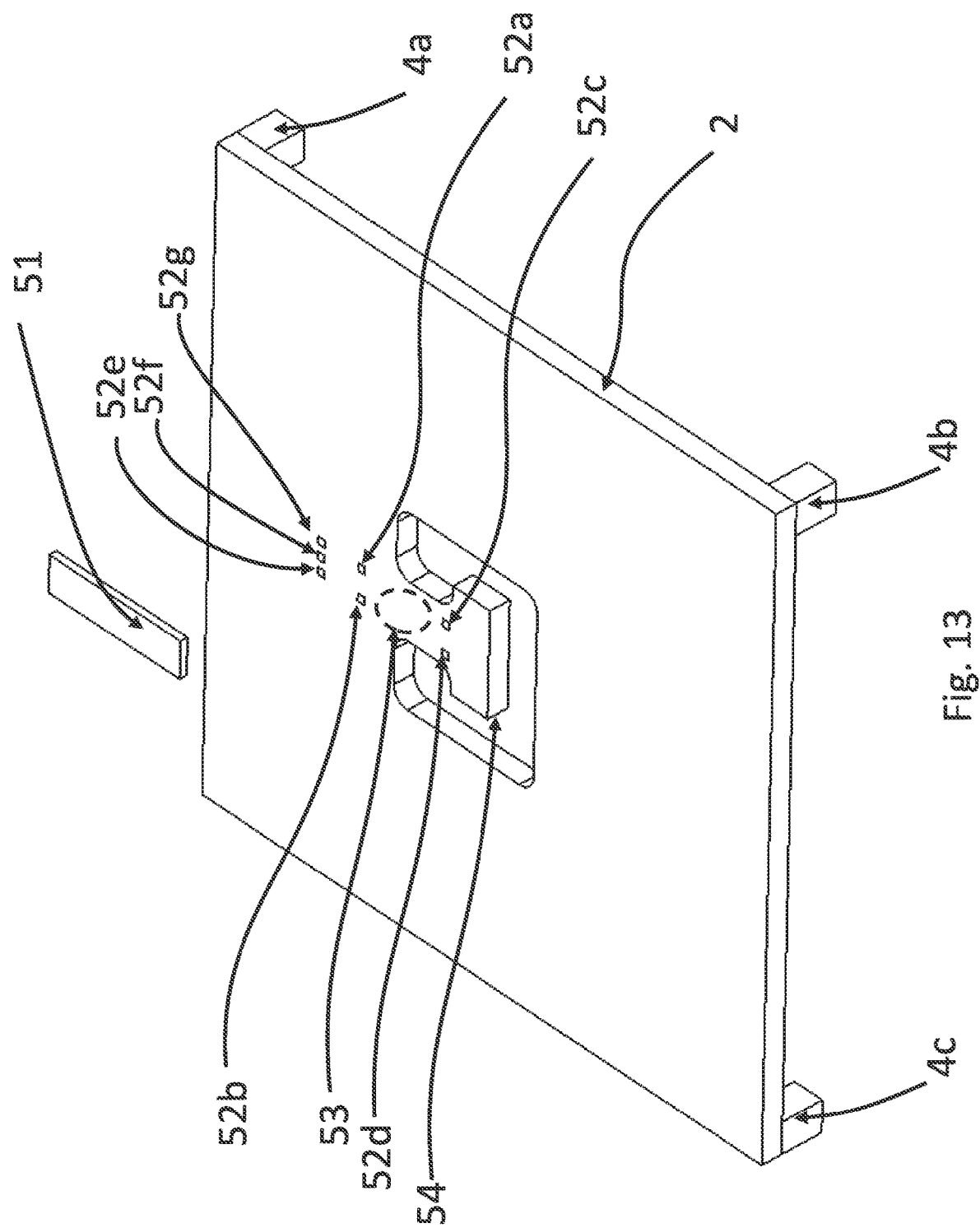
FIG. 13 illustrates a DSSD for mounting on a flexure in a PC board having pads according to an embodiment of the disclosed subject matter.

Bonds pads 47a, 47b, 47c, 47g, and 47f are shown, which correspond to the bond pads 12a, 12b, 12c, 12d and 12e shown in FIG. 4. Bond pads 47d and 47e may be added along the length of the strain sensing device shown in FIG. 12 such that the strain is limited to the region of piezoresistor 44. FIG. 13 shows a DSSD 51 mounted on a PC board 2 having pads 52a and 52b, as well as pads 52d, 52e, 52f, and 52g. Pads 52a and 52b correspond to additional bond pads 47d and 47e shown in FIG. 12. Area 53 is the region of maximum bending strain for flexure 54 when a force is applied to the tip of the flexure. Strain gage 44 (FIG. 12) will experience the strain but bond pads 52a and 52b will isolate the rest of the circuitry from the strain and resulting fatigue.

In some embodiments, the DSSD is mounted with the circuitry facing towards the PC board or away from the PC board, which results in a tradeoff. By mounting the DSSD with the circuitry towards the PC board, it is easier to mount the DSSD using reflow solder techniques but the strain gage 10 will be closer to the neutral axis of bending. The neutral axis of bending may be defined as the position in the cross-section of the beam or a plate that experiences little to no strain when bending. By mounting the DSSD with the circuitry facing away from the surface of the PC board, the strain gage 10 will experience the maximum possible strain when a force is exerted on the PC board, as shown in FIG. 2a. For a typical printed circuit board thickness of between 0.3 mm and 1 mm and a typical DSSD thickness of between 100 and 400 micrometers, it will be possible to ensure that the neutral axis of bending remains inside the PC board. Therefore, the simple configuration with the DSSD facing towards the PC board will be usable.

FIGS. 14A and 14B depict these different mounting configurations for the DSSD in greater detail. In FIG. 14A, DSSD 56 is mounted such that strain gage 57 is as far away from the neutral axis of bending 61, as possible. As a result, the bond pads 58a and 58b are formed such that the solder joints 59a and 59b can attach to them on the sides of DSSD 56. In FIG. 14b, DSSD 63 is mounted such that the strain gage 64 is closer to the neutral axis of bending 68. Thus, bond pads 65a and 65b require less processing to manufacture when compared to bond pads 58a and 58b. The solder joints 66a and 66b also are easier to form than 59a and 59b. The distance from the neutral axis 67 in FIG. 14b is less than the distance from the neutral axis 60 in FIG. 14a. If force 20 is applied to flexure 55 and a force of same magnitude 24 is applied to flexure 62, then strain gage 64 will experience less strain than strain gage 57, if flexures 55 and 62 have the same dimensions and materials. Strain gage 64 may have less sensitivity than strain gage 57, but will have a potentially simpler assembly and a lower cost. For most applications of the disclosed embodiments, the configuration shown in FIG. 14b should have sufficient sensitivity.

Figure 15:
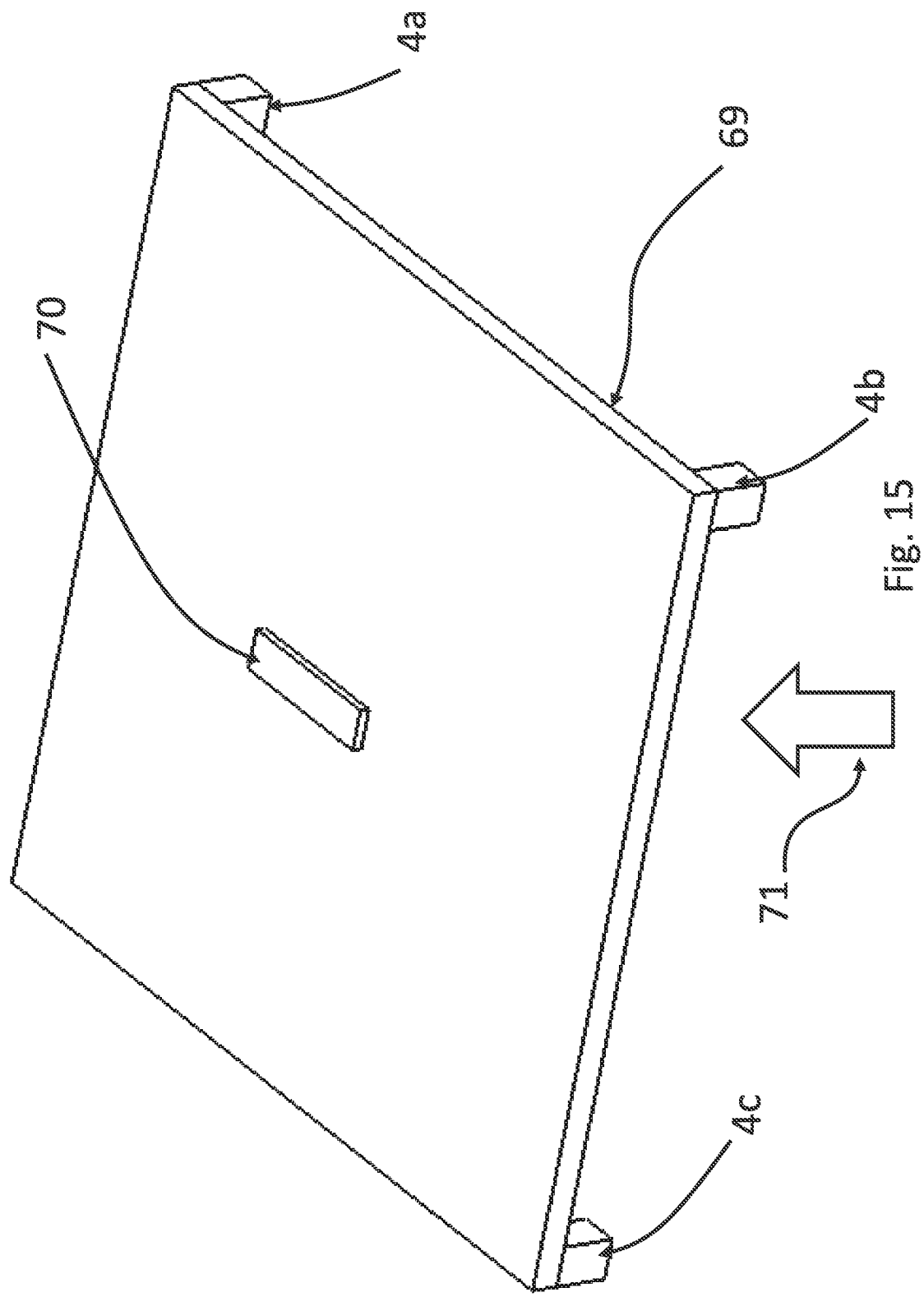
FIG. 15 illustrates a DSSD mounted on a PC board without a flexure according to an embodiment of the disclosed subject matter.

FIG. 15 shows a DSSD 70 mounted to a PC board 69. PC board 69 may differ from the PC boards disclosed above as it does not include a flexure. It may not be necessary to always have a flexure in the device. In some embodiments, PC board 69 will bend when force 71 is applied in the region where DSSD 70 is mounted. Less strain may be experienced than with a flexure configuration but the amount of strain may be sufficient for some applications.

Figure 11:
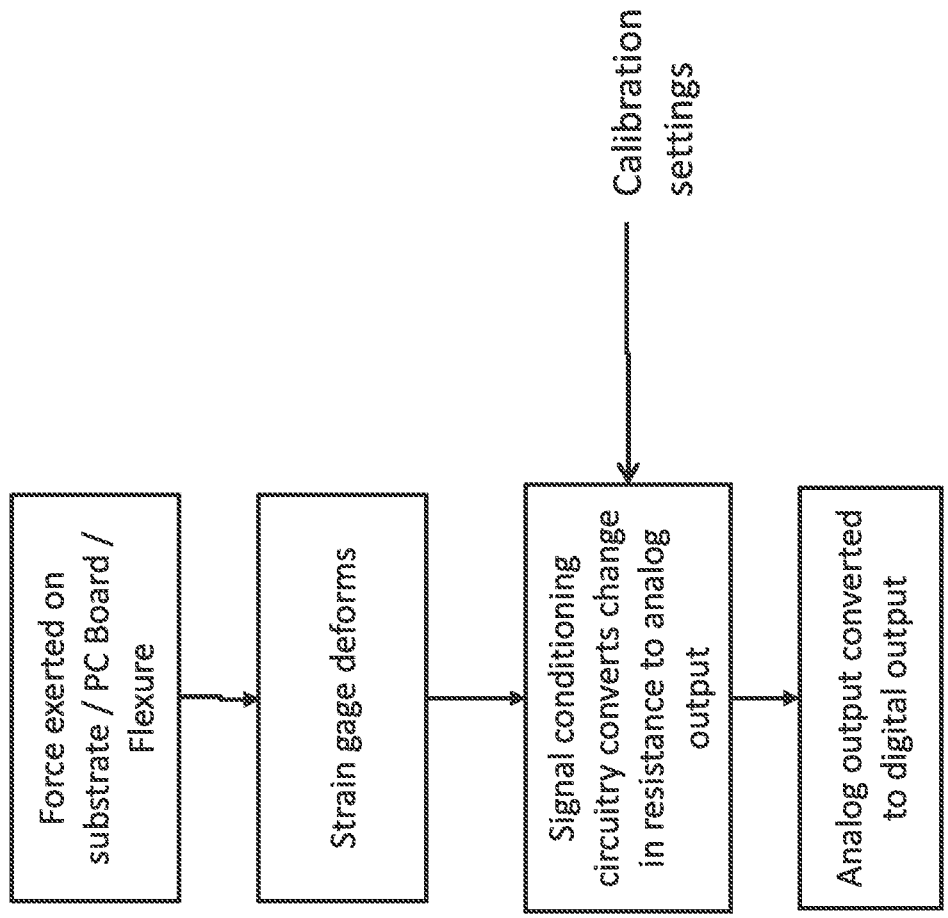
FIG. 11 illustrates a flowchart for using the interface device with a strain gage according to an embodiment of the disclosed subject matter.

FIG. 11 shows a flowchart for performing operations using the DSSD having a strain gage according to the disclosed embodiments. A first step may be executed by having a force exerted on the substrate, PC board, or flexure, as disclosed above. The second step executes by deforming the strain gage within the DSSD. This step changes the spacing between the atoms in the substrate and in the strain gage material of the DSSD. The third step executes by having the signal conditioning circuitry convert the resulting change in resistance caused by the strain due to the applied force to an analog output. Calibration settings may be set to determine the sensitivity of the circuitry and how the resistance is detected. As disclosed above, several different configurations may be implemented depending on the parameters set forth for the interface device. A fourth step executes by converting the analog output to digital output that can be used by the electronic device.

FIG. 16 shows another configuration where the DSSD 72 is positioned in a recess 74 formed in the flexure 75. By making a recess in the flexure and by positioning the DSSD such that it will primarily be in compression, the solder joints 73a and 73b will be primarily in compression and thus will be less prone to fatigue due to repeated bending of flexure 75 due to the applied force 76. The recess may be formed by any of a number of manufacturing processes such as milling, stamping, etching or injection molding.

FIG. 17 illustrates a computing system used in connection with the semiconductor strain gage according to an embodiment of the disclosed subject matter. The computing system includes a communications infrastructure 1701, a signal conditioning circuit 1703, main memory 1705 that includes control logic 1707, storage module 1709 which includes a hard disk drive and/or a solid state drive 1711 and/or removable storage 1713, a processing unit 1715, a communications interface 1717, a system control logic 1719, and semiconductor strain gage 1721, and the buttons of the electronic apparatus 1723 (alternatively the flexure or the point where the force is to be exerted on the printed circuit board). Other components may be included in computing system not shown in FIG. 17.

The computing system is used to communicate between various modules, components, and devices of the electronic apparatus to sense force and perform an action in response to the sensed force.

The communications infrastructure 1701 allows communications to and from various components 1703-1719 of the computing system. For example, the user of an electronic apparatus may press a button 1723. In response, the semiconductor strain gage 1721 may incur a change in resistance or conductivity.

The signal conditioning circuit 1703 may receive this change of resistance or conductivity information from the semiconductor strain gage 1721. The signal conditioning circuit 1703 may convert that change of resistance or conductivity into a digital signal and then communicate with the processing unit 1715 through the communications infrastructure 1701 to process the digital signal sent to the processing unit 1715 from the signal conditioning circuit 1703. In response, the processing unit 1715 may process the received digital signal and send an activation signal that would result in a feature of the electronic apparatus to be turned ON or OFF The processing unit may be a processor, such as a math co-processor, graphics processor/accelerator, or a Digital Signal Processor (DSP). Alternatively, the processing unit may be a processing circuit. Main memory 1705 may include RAM (Random Access Memory), ROM (Read Only Memory), and other storage means, mapped to one addressable memory space. Main memory 1705 illustrates one of many types of computer storage media for storage of information such as computer readable instructions, data structures, program modules or other data. For example, main memory 1705 may store information relating to magnitude of force exerted, the amount of deformation or bending of the printed circuit board (or the flexure of the printed circuit board), the type of digital signal generated and the computing system may access this information from the main memory 1705 to perform its operations.

It will be apparent to those skilled in the art that various modifications and variations can be made in the disclosed embodiments of the disclosed device and associated methods without departing from the spirit or scope of the invention. Thus, it is intended that the present invention covers the modifications and variations of the embodiments disclosed above provided that the modifications and variations come within the scope of any claims and their equivalents.

What is claimed is:

1. An interface device for an electronic apparatus comprising:
   a printed circuit board having a plurality of layers, wherein one or more of the layers is a conductive layer;
   a strain sensing device comprising
      a substrate, wherein the substrate is formed from a material which is not the same material as the printed circuit board,
      at least one strain sensing element formed on the substrate, wherein the strain sensing device is mounted on the printed circuit board,
      and a signal conditioning circuit formed on the substrate and connected to the strain sensing element,
      wherein the strain sensing device measures the deformation or bending of the printed circuit board in response to an applied force or strain on the printed circuit board, wherein the deformation or bending results in the change of resistance or conductivity of the strain sensing element, wherein the amount of change of resistance or bending is translated into a digital signal; and
   a processing unit communicatively connected to the printed circuit board and the strain sensing device, wherein the processing unit receives the digital signal thereby resulting in an action executed by the processing unit.

2. The interface device of claim 1, wherein a flexure is formed within the printed circuit board, wherein the force is applied to the flexure, wherein the flexure includes a plurality of sides, wherein at least one side is attached to the printed circuit board thereby providing structural stability to the flexure, wherein a plurality of sides are not attached to the printed circuit board, wherein the flexure is situated such that either the top, bottom, or both top and bottom of the flexure is able to deform or bend when a force is applied.

3. The interface device of claim 2, wherein the flexure has a length of between 2 mm and 10 mm, wherein the printed circuit board has a thickness of between 0.2 mm and 2 mm and wherein the flexure is designed to have a maximum strain of between 10 and 1000 microstrain when a force of between 0.1 and 10 N is applied to the flexure.

4. The interface device of claim 1, further comprising a signal conditioning circuit, wherein the signal conditioning circuit is formed on the substrate of the strain sensing device, wherein the signal conditioning circuit converts the change of resistance or conductivity of the strain sensing element into the digital signal.

5. The interface device of claim 4, wherein the signal conditioning circuit communicates with the processing unit to relay the digital signal.

6. The interface device of claim 4, wherein the conductive layer of the printed circuit board is used for communicating with the processing unit through the signal conditioning circuit.

7. The interface device of claim 1, wherein the processing unit is a processor or processing circuit.

8. The interface device of claim 1, wherein the strain sensing element is a semiconductor strain gage.

9. The interface device of claim 1, where substrate of the strain sensing device is attached to the printed circuit board with an epoxy.

10. The interface device of claim 1, wherein the substrate of the strain sensing device is attached to the printed circuit board with solder.

11. The interface device of claim 10, wherein the solder includes a filler material.

12. The interface device of claim 1, wherein the strain sensing device includes a plurality of bond pads.

13. The interface device of claim 12, wherein the plurality of bonds pads define the outline of two or more regions, wherein a region contains either a strain gage or a signal conditioning circuit.

14. The interface device of claim 1, wherein the substrate of the strain sensing device is mounted in a recess in the printed circuit board.

15. The interface device of claim 1, wherein the action executed by the processing unit is either to turn a switch to an ON or an OFF position for a desired feature of the electronic apparatus.

16. A method of sensing a force applied to a printed circuit board of an electronic apparatus, the method comprising:
exerting a force on a printed circuit board thereby resulting in the bending or deforming of the printed circuit board; wherein the magnitude of force exerted is directly related to the amount of deformation such that a force with a smaller magnitude results in a smaller deformation and a force with a larger magnitude results in a larger deformation;
measuring the bending or deformation of the printed circuit board using a strain sensing device, wherein the strain sensing device comprises
a substrate, wherein the substrate is formed from a material which is not the same material as the printed circuit board,
at least one strain sensing element formed on the substrate, wherein the strain sensing device is mounted on the printed circuit board,
and a signal conditioning circuit formed on the substrate and connected to the strain sensing element;
changing the resistance or conductivity of the strain sensing device, wherein the change in resistance of conductivity is in response to a force applied on the printed circuit board;
converting the change into an analog signal using a signal conditioning circuit that is coupled to the strain gage; and
converting the analog signal into a digital signal using the signal conditioning circuit; and
communicating the digital signal to a processing unit that is communicatively coupled to the strain gage such that the processing unit receives the digital signal and executes an action.

17. The method of claim 16, wherein a smaller force results in the processing unit to execute a first action for the electronic apparatus while a larger force results in the processing unit to execute a second action for the electronic apparatus.

18. The method of claim 17, wherein the first action and the second action activate the same feature of the electronic apparatus, wherein the first action provides a slower or lesser response while the second action provides a faster or higher response.

19. The method of claim 16, the force exerted on the printed circuit board is on a flexure, wherein a flexure is formed within the printed circuit board, wherein the flexure includes a plurality of sides, wherein at least one side is attached to the printed circuit board thereby providing structural stability to the flexure, wherein a plurality of sides are not attached to the printed circuit board, wherein the flexure is situated such that either the top, bottom, or both top and bottom of the flexure is able to deform or bend when a force is applied.

20. The method of claim 19, wherein the force exerted results in the bending of the flexure.

21. The method of claim 16, wherein the amount of bending of the printed circuit board is reduced by applying an epoxy or solder to the substrate that is mounted on the printed circuit board.

* * * * *